(12) United States Patent
Kobayashi

(10) Patent No.: US 9,016,342 B2
(45) Date of Patent: Apr. 28, 2015

(54) BONDING APPARATUS AND BONDING METHOD

(75) Inventor: Kazuhiko Kobayashi, Chikuma (JP)

(73) Assignee: Apic Yamada Corporation, Chikuma-shi (JP)

( * ) Notice: Subject to any disclaimer, the term of this patent is extended or adjusted under 35 U.S.C. 154(b) by 350 days.

(21) Appl. No.: 13/184,084

(22) Filed: Jul. 15, 2011

(65) Prior Publication Data

US 2012/0247664 A1    Oct. 4, 2012

(30) Foreign Application Priority Data

Mar. 28, 2011  (JP) ................................. 2011-069344
Apr. 27, 2011  (JP) ................................. 2011-099610

(51) Int. Cl.
*B32B 37/10*     (2006.01)
*H01L 23/00*     (2006.01)

(52) U.S. Cl.
CPC ................. *H01L 24/75* (2013.01); *H01L 24/81* (2013.01); *H01L 24/83* (2013.01); *H01L 24/92* (2013.01); *H01L 24/95* (2013.01); *H01L 2224/73204* (2013.01); *H01L 2224/75102* (2013.01); *H01L 2224/75252* (2013.01); *H01L 2224/753* (2013.01); *H01L 2224/75313* (2013.01); *H01L 2224/75315* (2013.01); *H01L 2224/75317* (2013.01); *H01L 2224/7532* (2013.01); *H01L 2224/755* (2013.01); *H01L 2224/75704* (2013.01); *H01L 2224/75755* (2013.01); *H01L 2224/75756* (2013.01); *H01L 2224/75804* (2013.01); *H01L 2224/7598* (2013.01);

(Continued)

(58) Field of Classification Search
USPC ......... 156/285–287, 381, 382, 580, 581, 582; 269/21; 100/264–268
See application file for complete search history.

(56) References Cited

U.S. PATENT DOCUMENTS 4,334,850 A * 6/1982 Garabedian ................... 425/388
5,660,380 A * 8/1997 Reis et al. ....................... 269/21

(Continued)

FOREIGN PATENT DOCUMENTS

JP        11-121484 A    4/1999
JP       2000-100837 A   4/2000

(Continued)

*Primary Examiner* — Christopher Schatz
(74) *Attorney, Agent, or Firm* — Birch, Stewart, Kolasch & Birch, LLP

(57) ABSTRACT

The bonding apparatus is capable of effectively increasing temperature of a substrate and reducing occurrence of position gaps and poor connection in a process of flip-chip-bonding semiconductor devices to the substrate. The bonding apparatus comprises: a supporting unit for supporting the substrate, on which the semiconductor devices have been adhered by a non-conductive; and a heating/pressing unit for heating and pressing the substrate, the heating/pressing unit having a built-in heat source and a clamping face, onto which the substrate supported by the supporting unit is pressed. The substrate supported by the supporting unit is moved toward the clamping face of the heating/pressing unit so as to preheat the substrate and the semiconductor devices by radiation heat. Then, the semiconductor devices are pressed onto the clamping face of the heating/pressing unit so as to cure the non-conductive adhesive and bond bumps of the semiconductor devices to terminal sections of the substrate.

8 Claims, 23 Drawing Sheets

(52) U.S. Cl.
CPC ............... *H01L 2224/75984* (2013.01); *H01L 2224/81048* (2013.01); *H01L 2224/8109* (2013.01); *H01L 2224/81093* (2013.01); *H01L 2224/83048* (2013.01); *H01L 2224/8309* (2013.01); *H01L 2224/83093* (2013.01); *H01L 2224/83855* (2013.01); *H01L 2224/9211* (2013.01); *H01L 2224/95093* (2013.01); *H01L 2224/97* (2013.01); *H01L 2924/01029* (2013.01); *H01L 2924/01033* (2013.01); *H01L 2924/01079* (2013.01); *H01L 2924/01082* (2013.01); *H01L 2924/09701* (2013.01); *H01L 2924/01005* (2013.01); *H01L 2924/01006* (2013.01); *H01L 2924/01019* (2013.01); *H01L 2924/01074* (2013.01); *H01L 2924/014* (2013.01); *H01L 2224/16225* (2013.01); *H01L 2224/32225* (2013.01)

(56) References Cited

U.S. PATENT DOCUMENTS

| | | | |
|---|---|---|---|
| 2003/0173035 A1* | 9/2003 | Yamaguchi | 156/580 |
| 2006/0005921 A1* | 1/2006 | Lee et al. | 156/285 |
| 2006/0016555 A1* | 1/2006 | Yamauchi et al. | 156/285 |
| 2007/0274669 A1* | 11/2007 | Chen et al. | 385/147 |

FOREIGN PATENT DOCUMENTS

| | | | |
|---|---|---|---|
| JP | 2000-340589 A | 12/2000 |
| JP | 2003-289088 A | 10/2003 |
| JP | 2004-311709 A | 11/2004 |
| JP | 2005-26608 A | 1/2005 |
| JP | 2006-120724 A | 5/2006 |
| JP | 2008-294026 A | 12/2008 |

\* cited by examiner

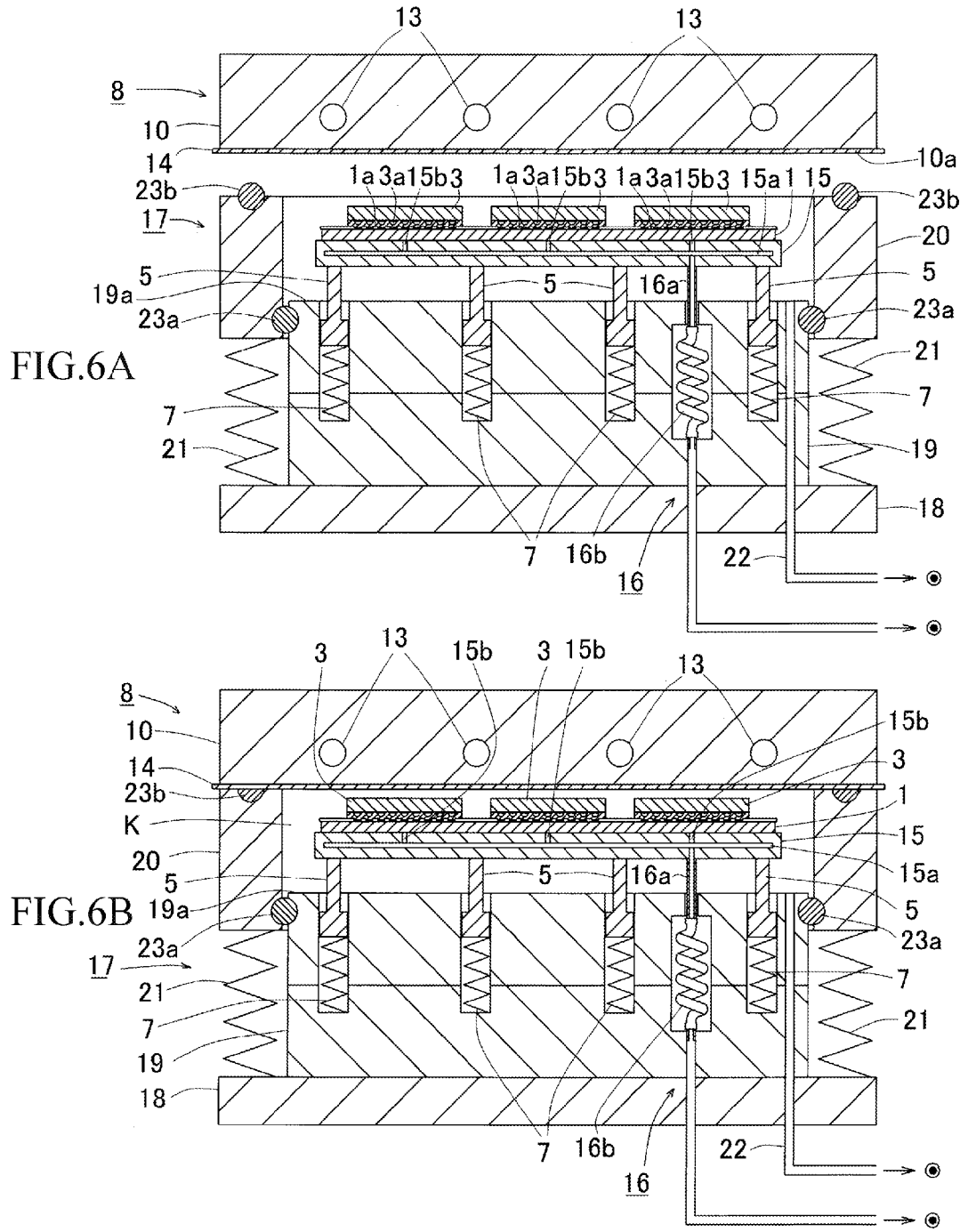

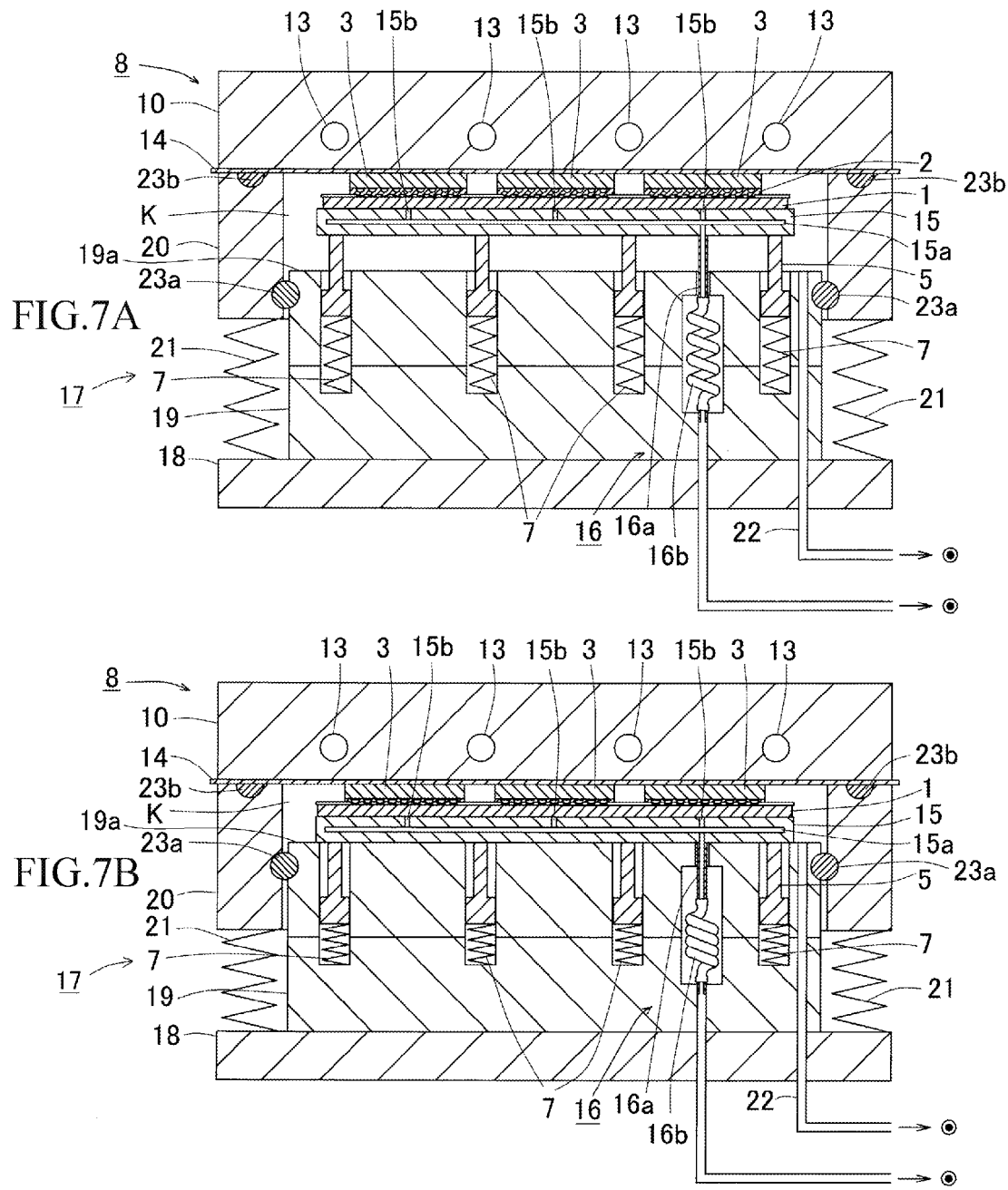

EXPANSION OF SUBSTRATE

BONDING APPARATUS AND BONDING METHOD

CROSS-REFERENCE TO RELATED APPLICATION

This application is based upon and claims the benefit of priority of the prior Japanese Patent Applications No. P2010-020978 (filed on Feb. 2, 2010), P2011-069344 (filed on Mar. 28, 2011) and P2011-099610 (filed on Apr. 27, 2011) and the entire contents of which are incorporated herein by reference.

FIELD

The present invention relates to a bonding apparatus and a bonding method for, for example, flip-chip-bonding bumps of semiconductor devices, which are adhered on a substrate by a non-conductive adhesive, to terminal sections of the substrate.

BACKGROUND

In FIG. 23A, cable patterns are formed on a substrate 51, and semiconductor devices (flip chips) 53 are adhered to terminal sections 51a of the substrate 51 by applying a non-conductive adhesive 52, e.g., NCF (non-conductive film), NCP (non-conductive paste). In this state, metal bumps 54, e.g., solder bumps, gold bumps, of the semiconductor devices 53 are not electrically bonded to the terminal sections 51a.

For example, the substrate 51 is set on a lower die 55 and clamped between the lower die 55 and an upper die 56. In this state, the substrate 51 is heated until reaching a melting point of the metal bumps 54, so that the semiconductor devices 53 are electrically bonded to the terminal sections 51a, the non-conductive adhesive 52 cures and the semiconductor devices 53 are underfilled.

Further, a conventional bonding apparatus, in which each of semiconductor devices is temporally compression-bonded to a lead frame and then the semiconductor devices are completely thermal-compression-bonded thereto at a time, is disclosed in Japanese Laid-open Patent Publication No. 2000-100837.

In case of flip-chip-bonding the semiconductor devices 53 to the substrate 51, whose thermal expansion coefficient is great, at a time, the substrate 51 is heated in, for example, a reflow furnace until reaching the melting point of the metal bumps 54, e.g., melting point of solder, curing temperature of the adhesive. By heating the substrate 51, the substrate 51 is thermally expanded as shown in FIG. 23B. If the semiconductor devices 53 are compression-bonded to the substrate 51 in this state, position gaps will be occurred between the metal bumps 54 and the terminal sections 51a and poor connection will occur.

Further, in case of heating and pressing the substrate 51 and the semiconductor devices 53 which are clamped by the dies 55 and 56, heat generated by a heater of the upper die 56 is absorbed by the lower die 55 via the substrate 51 and the semiconductor devices 53, and a thermal capacity for heating the substrate 51 and the semiconductor devices 53 are increased. Therefore, a heating time until reaching the melting point of the metal bumps 54, e.g., melting point of solder, curing temperature of the adhesive, must be long. In case of using some types of solder, the adhesive 52 cures before the solder bumps 54 are electrically bonded, so there is a possibility of occurring poor connection.

If the heating time is long, air included in the adhesive 52 will be expanded or foamed and adhesive force for retaining the semiconductor devices will be reduced.

SUMMARY

Accordingly, it is objects to provide a bonding apparatus and a bonding method capable of solving the above described problems of the conventional bonding apparatus. Namely, the bonding apparatus and the bonding method of the present invention are capable of effectively increasing temperature of a substrate and reducing occurrence of position gaps and poor connection in a process of flip-chip-bonding semiconductor devices.

To achieve the object, the present invention has following structures.

Namely, the bonding apparatus of the present invention flip-chip-bonds bumps of semiconductor devices, which have been adhered on a substrate by a non-conductive adhesive, to terminal sections of the substrate. The bonding apparatus comprises:

supporting means for supporting the substrate, on which the semiconductor devices have been adhered; and heating/pressing means for heating and pressing the substrate, the heating/pressing means having a built-in heat source and a clamping face, onto which the substrate supported by the supporting means is pressed, the substrate, which is supported by the supporting means, is moved toward the clamping face of the heating/pressing means so as to preheat the substrate and the semiconductor devices by radiation heat, and the semiconductor devices are pressed onto the clamping face of the heating/pressing means, in the state where the substrate is supported by the supporting means, so as to cure the non-conductive adhesive and bond the bumps of the semiconductor devices to the terminal sections of the substrate.

Note that, the word "bonding" means not only electrical connection between the bumps and the terminal sections but also connection performed by a conductive adhesive and thermal compression bonding the melted bumps.

Another bonding apparatus of the present invention bonds laminated members of a work, which are laminated with an adhesive layer. The bonding apparatus comprises:

an upper die; and a lower die for clamping the work with the upper die, the upper die includes a first heating/pressing section for heating and pressing the work, and the lower die includes: a second heating/pressing section for heating and pressing the work, the second heating/pressing section being moved upward and downward; and a supporting section being relatively retracted into a clamping face of the second heating/pressing section by relatively moving the second heating/pressing section upward, the supporting section being relatively projected from the clamping face of the second heating/pressing section by relatively moving the second heating/pressing section downward.

By employing the bonding apparatus of the present invention, reliability of bonding constructional members of the work, which are adhered by the adhesive, can be improved.

For example, the semiconductor devices and the substrate are preheated, and then heated to bond the semiconductor device to the substrate at a time, so that occurrence position gaps between the bumps and the terminal sections can be prevented.

The substrate, on which the semiconductor devices are adhered, is supported, by the supporting means, and separated from the clamping face, so that a thermal capacity of the substrate can be reduced and the substrate, etc. can be heated in a short time. Therefore, poor connection, which is caused by rapidly curing the non-conductive adhesive, can be prevented.

Further, the heating/pressing step is performed in the reduced-pressure atmosphere or the pressurized atmosphere according to properties of the adhesive. Therefore, influences of voids formed in the adhesive can be restrained, and enough adhesive force for retaining the semiconductor devices can be maintained.

BRIEF DESCRIPTION OF THE DRAWINGS

Embodiments of the present invention will now be described by way of examples and with reference to the accompanying drawings, in which:

FIGS. 6A and 6B are sectional views of a bonding apparatus of Embodiment 3, in which a bonding step is performed;

FIGS. 7A and 7B are sectional views of the bonding apparatus of Embodiment 3, in which the bonding step is performed;

DETAILED DESCRIPTION OF THE EMBODIMENTS

Preferred embodiments of the bonding apparatus and the bonding method relating to the present invention will now be described in detail with reference to the accompanying drawings.

Embodiment 1

Embodiment 1 of the present invention will be explained with reference to FIGS. 1A-2B.

Figure 1A:
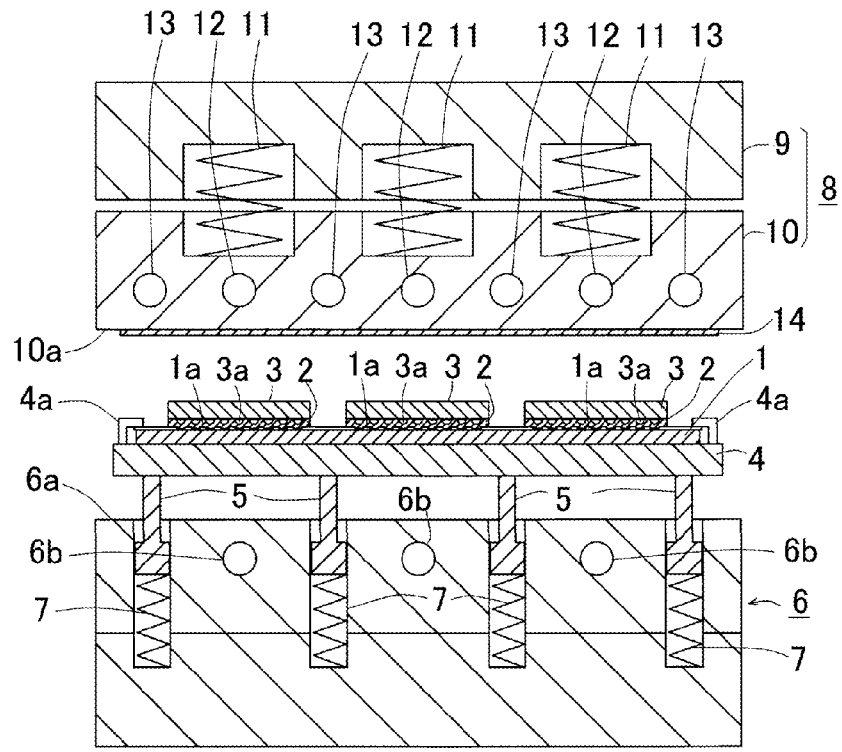
FIGS. 1A and 1B are sectional views of a bonding apparatus of Embodiment 1, in which a bonding step is performed.

In FIG. 1A, a substrate 1, on which cable patterns have been formed, has terminal sections 1$a$, on which semiconductor devices 3, e.g., semiconductor chips, are adhered by a thermosetting non-conductive adhesive 2, e.g., NCF, NCP. The substrate 1, on which the semiconductor devices 3 are adhered, is an organic substrate, but other types of substrates, e.g., inorganic ceramic substrate, may be employed. Further, lead frames, semiconductor wafer, etc. may be employed as the substrate. A plurality of lines and rows of the semiconductor devices 3 are adhered by a known flip-chip bonder (not shown).

Edges of the substrate 1 are held by chucks 4$a$, so that the substrate 1 is held by a substrate holding plate 4. A bottom face of the substrate holding plate 4 is supported by a plurality of supporting rods 5 so as to hold the substrate 1 without deformation. As shown in FIG. 1A, the supporting rods 5 are located at the positions shifted from the semiconductor devices 3 so as to prevent the semiconductor devices 3 from being disproportionately supported or pressed. Coil springs 7 are provided to a lower die (supporting means) 6 so as to floating-support the supporting rods 5 in a state where upper ends of the supporting rods 5 are separated from a clamping face 6$a$ of the lower die 6. In a normal state, projecting lengths of the supporting rods 5, from the clamping face 6$a$, are equal, so that the substrate holding plate 4 are uniformly separated from an upper die 8. The supporting rods 5 are equally spaced, so that the substrate holding plate 4 is horizontally held without being bent by own weight. The lower die 6 is moved upward and downward by a die driving mechanism (not shown). Note that, in case of using a hard and less flexible substrate, e.g., ceramic substrate, the substrate holding plate 4 may be omitted and the substrate 1 may be directly supported by the supporting rods 5.

With this structure, when the substrate 1 is heated by heaters (heat source) 13 provided in an upper die (heating/pressing means) 8, thermal resistance immediately under the substrate 1 can be increased and heat loss can be restrained. In other words, a temperature of the substrate 1 can be increased in a short time by reducing heat capacity of the structural members contacting the substrate 1. Therefore, poor connection caused by rapid curing of the non-conductive adhesive 2 can be restrained.

Figure 3A:
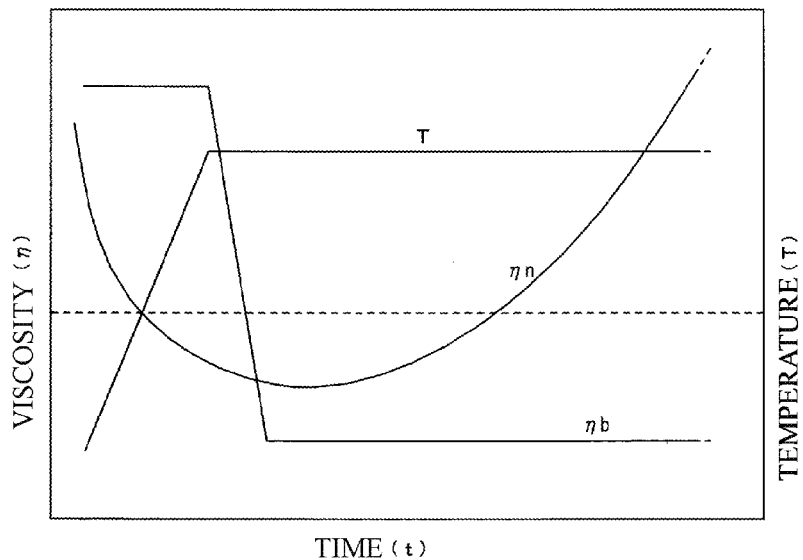
FIGS. 3A and 3B are explanation views explaining effects of the bonding step.
Figure 3B:
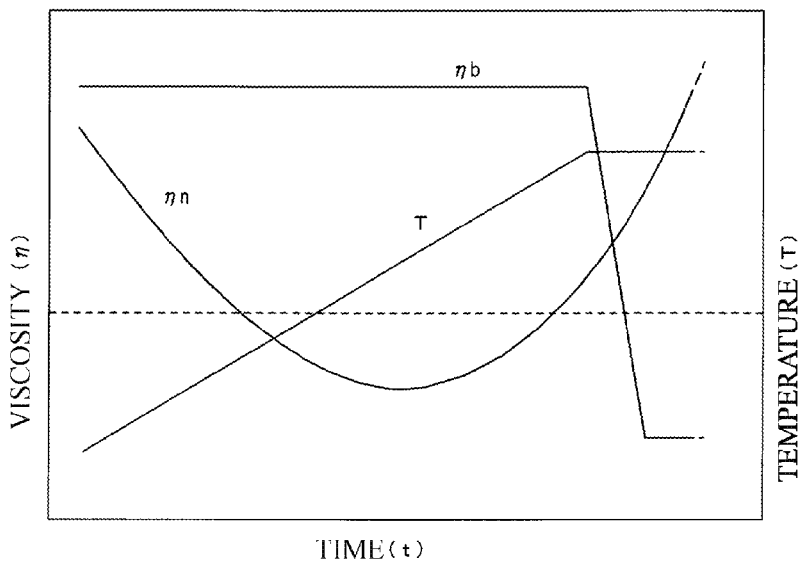

For example, as shown in FIG. 3A, the temperature T of the substrate 1 can be increased in a short time. Therefore, timing of minimizing viscosity ηn of the non-conductive adhesive 2 can be corresponded to timing of minimizing viscosity ηb of the melted bumps 3$a$. Note that, the viscosity η in of the non-conductive adhesive (thermosetting resin) 2 is minimized when a prescribed amount of heat is applied. In a range where the viscosity ηn is lower than a dotted line, the viscosity of the melted bump 3$a$ is suitably decreased and the bumps 3$a$ can be bonded. Therefore, the bumps 3$a$ of the semiconductor devices 3 can be securely electrically bonded to the substrate 1. Note that, in case that the temperature T of the substrate 1 cannot be increased in a short time as shown in FIG. 3B, the timing of minimizing the viscosity ηn is earlier than that of minimizing the viscosity ηb. Namely, the timings cannot be corresponded. So, there is possibility that the bumps 3a are not securely electrically connected.

As shown in FIG. 1A, the upper die 8 is constituted by an upper die base 9 and an upper die block 10, which is suspended, from the upper die base 9, by coil springs 11. Spring force of the coil springs 11 is greater than that of the coil springs 7. Note that, the coil springs 11 may be omitted. Coolers 12, which respectively correspond to the semiconductor devices 3, and the heaters 13, which do not correspond to the semiconductor devices 13, are alternately arranged in the upper die block 10. The upper die block 10 preheats the substrate 1 and the semiconductor devices 3 by radiation heat when the substrate 1 and the semiconductor devices 3 are moved close to the upper die block 10. Further, the upper die block 10 bonds (flip-chip-bonds) the bumps 3a, e.g., solder bumps, gold bumps, to the terminal sections 1a of the substrate 1 when the semiconductor devices 3 are pressed onto the upper die block 10.

For example, if the dies 6 and 8 are opened in a state where the bumps 3a are melted, there is possibility that poor connection occurs between the bumps 3a and the terminal sections 1a. Therefore, the coolers 12 are provided. The dies 6 and 8 are opened in a state where the bonded parts between the bumps 3a and the terminal sections 1a are fully cooled and cured by the coolers 12. Coolers 6b, which correspond to the terminal sections 1a, may be provided in the lower die 6 in light of cooling efficiency. If a temperature of the lower die 6 is overheated by repeating the bonding operations of the semiconductor devices, curing the non-conductive adhesive 2 is excessively accelerated. However, the problem can be solved by the coolers 6b. Further, the entire dies can be cooled rapidly, so that throughput of the bonding operation can be improved.

Note that, the upper die 8 including no coolers 12 may be used as a heating die, and the lower die 6 may be used as a cooling die. Further, the lower die 6 may have heaters, the both dies 6 and 8 may be used as heating dies. In this case too, the substrate holding plate 4 is floating-supported by the supporting rods 5, so that conducting heat to the substrate 1 from the both dies 6 and 8 can be effectively prevented. Therefore, curing the non-conductive adhesive 2 can be delayed while the substrate 1 is set and pressed.

A release film 14 is sucked and held on a clamping (contacting) face 10a of the upper die block 10, which will clamp (contact) the semiconductor devices 3. The release film 14 has enough heat resistance to heat of the heaters 13. The release film 14 can be easily peeled off from the clamping face 10a and has enough flexibility and extensibility. The release film 14 may be composed of PTFE, ETFE, PET, FEP film, glass cloth including fluorine, polypropylene film, polyvinylidene chloride, etc.

By using the release film 14, height variation of the semiconductor devices 3, from the substrate 1, can be absorbed. Further, the release film 14 prevents the melted adhesive 2 from attaching onto upper faces of the semiconductor devices 3. Therefore, contaminating the upper faces of the semiconductor devices 3 and the clamping face 10a, with the adhesive 2, can be prevented.

Next, a bonding step of the semiconductor devices 3 will be explained. In the bonding step, the semiconductor devices 3, which have been mounted or adhered by the non-conductive adhesive 2, are electrically bonded to the substrate 1.

Firstly, the flip-chip bonder (not shown) adheres the semiconductor devices 3, whose bumps 3a have been corresponded to the terminal sections 1a of the substrate 1, to the substrate 1 by the non-conductive adhesive 2. If the semiconductor devices 3 can be correctly positioned on the substrate 1 and held there while conveying them, the semiconductor devices 3 need not be adhered. Further, if the semiconductor devices 3 can be correctly positioned on the substrate 1, the non-conductive adhesive 2 may be applied to the entire surface of the substrate 1 to adhere the semiconductor devices 3.

Next, in FIG. 1A, the upper die 8 is heated by the heaters 13, the substrate 1 is transferred onto the substrate holding plate 4, which has been supported by the supporting rods 5 of the opened lower die 6, and then the edges of the substrate 1 are held by the chucks 4a. In this case, one substrate 1 may be set at the center part of the substrate holding plate 4, further a plurality of substrates 1 may be symmetrically set on the substrate holding plate 4. The substrate holding plate 4 is floating-supported by the supporting rods 5 and located above the clamping face 6a of the lower die 6. The release film 14 has been previously sucked and held on the clamping face 10a of the upper die block 10. Note that, the heaters 13 may be turned on after setting the substrate 1.

Figure 1B:
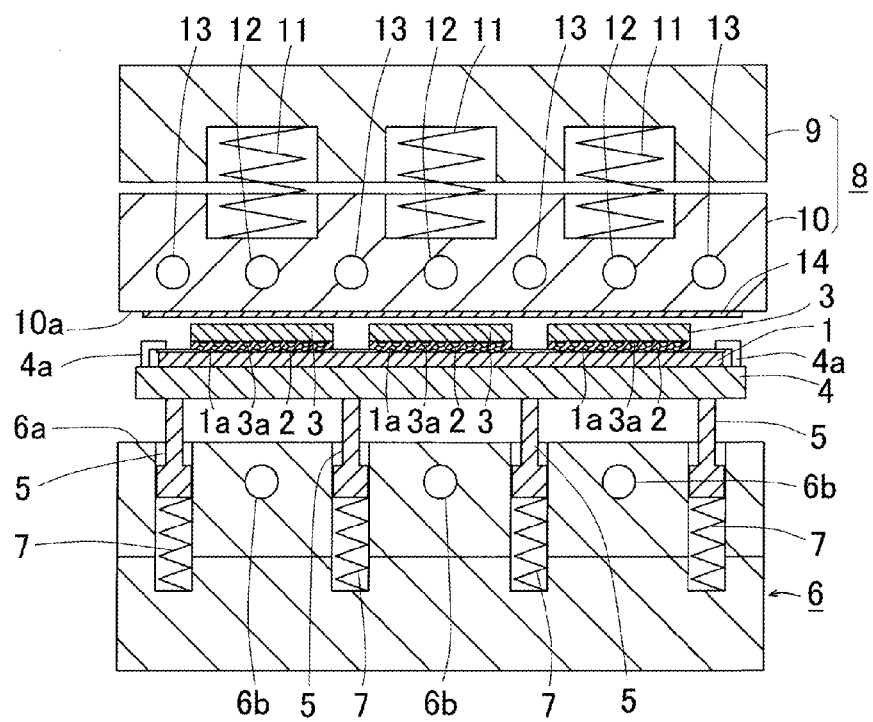

Next, in FIG. 1B, the lower die 6 is moved upward to move the semiconductor devices 3 toward the clamping face 10a of the upper die block 10. Therefore, the substrate 1 and the semiconductor devices 3, which are held by the substrate holding plate 4, are preheated, by radiation heat from the clamping face 10a heated by the heaters 13, until reaching a prescribed temperature, so that the substrate 1 is thermally expanded (linearly expanded). Preferably, the prescribed temperature is, for example, 10-30° C. lower than a melting point of the bumps 3a. In case of solder bumps, the melting point is 260° C., so the prescribed temperature may be around 240° C. In case of gold bumps, the melting point is 180° C., so the prescribed temperature may be around 160° C.

In comparison with a case of heating a substrate on a cooled block of a lower die, the non-conductive adhesive 2 and the bumps 3a can be rapidly heated by preheating the substrate 1 held on the substrate holding plate 4. Further, the substrate 1 can be fully expanded before clamping. On the other hand, in the case of heating and pressing the substrate on the cooled block of the lower die for compression bonding, a non-conductive adhesive will cure before melting bumps. In the present embodiment, this problem can be solved by the above described rapid heating.

Figure 2A:
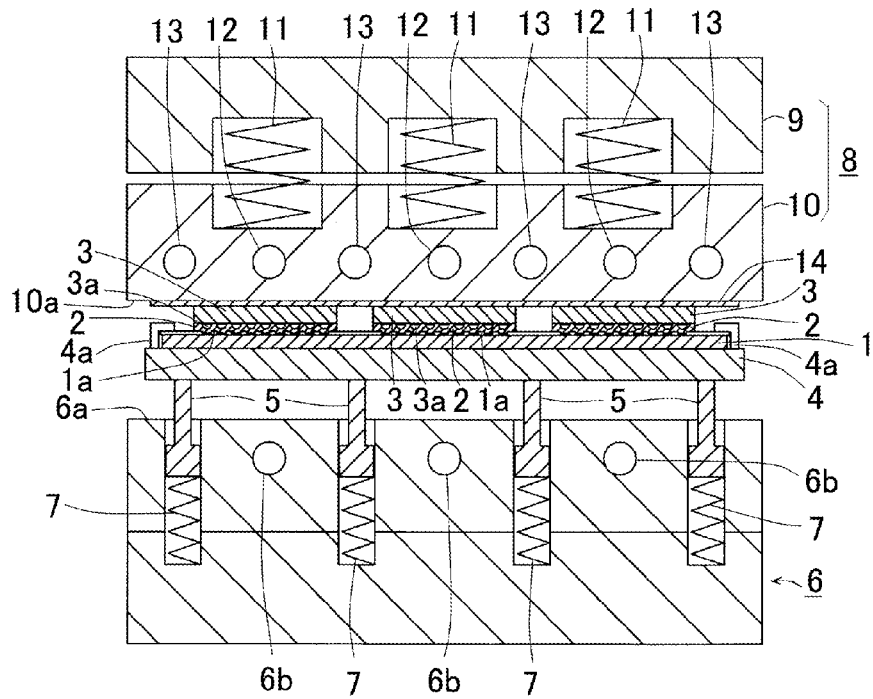
FIGS. 2A and 2B are sectional views of the bonding apparatus of Embodiment 1, in which the bonding step is performed.

Next, in FIG. 2A, the substrate 1 has been expanded by the preheating. In this state, the lower die 6 is further moved upward to press the semiconductor devices 3 onto the clamping face 10a of the upper die block 10, and then the semiconductor devices 3 are pressed and heated until reaching the melting point of the bumps 3a. Therefore, the bumps 3a are melted and electrically bonded to the terminal sections 1a.

In this action, the substrate 1 and the semiconductor devices 3 are clamped, between the upper die block 10 and the substrate holding plate 4, by the spring force of the coil springs 7 of the lower die 6.

Figure 2B:
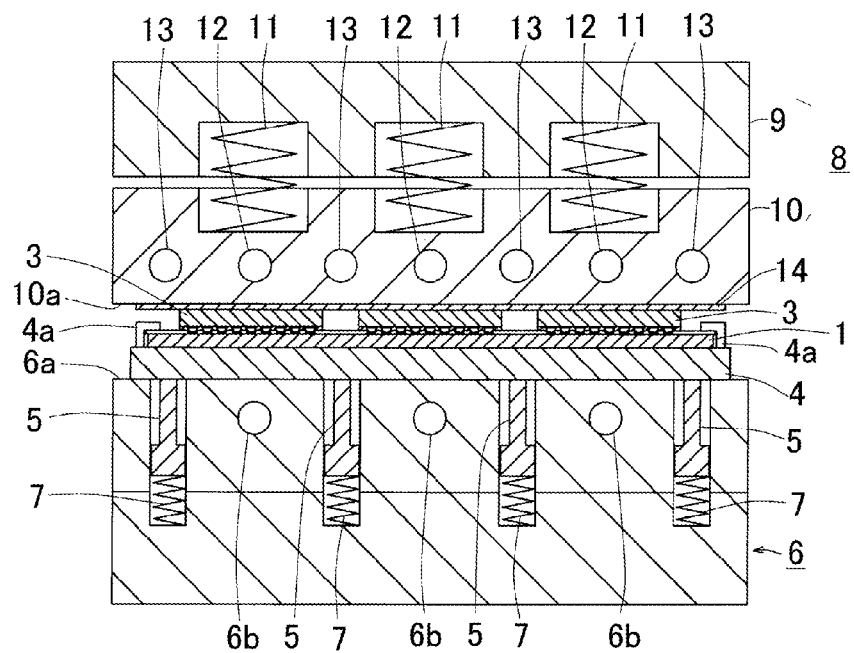

As shown in FIG. 2B, the lower die 6 is further moved upward. The supporting rods 5 are retracted into the lower die 6, with compressing the coil springs 7. Namely, the semiconductor devices 3 are pressed and heated until the substrate holding plate 4 contacts the clamping face 6a of the lower die 6. In this action, the substrate 1 and the semiconductor devices 3 are clamped, between the upper die block 10 and the substrate holding plate 4, by the spring force of the coil springs 11 of the upper die 8. Note that, the upward movement of the lower die 6 may be stopped at the position shown in FIG. 2A, and the semiconductor devices 3 may be heated and pressed there.

By the above described actions, the non-conductive adhesive 2 can cure after fully expanding the substrate 1, and the bumps 3a can be electrically bonded to the terminal sections 1a, so that the semiconductor devices 3 can be securely bonded to the substrate 1. With the above described structure, heat capacity of the structural members contacting the substrate 1 and the semiconductor devices 3 is small, so that the preheating can be efficiently performed. Further, the clamping action is performed and the bumps 3a are bonded to the terminal sections 1a in the state where the substrate 1 is expanded, and the bumps 3a can be bonded to the terminal sections 1a without occurring position gaps therebetween. The substrate 1 is floating-supported and can be heated in a short time by reducing heat capacity, so that poor connection, which is caused by heating the non-conductive adhesive 2 for a long time and rapidly curing the non-conductive adhesive 2, can be prevented.

Next, in FIG. 2B, the heaters 13 are turned off, and then the coolers 6b and 12 are turned on so as to cure the bonded parts between the bumps 3a and the terminal sections 1a. Next, the dies 6 and 8 are opened by moving the lower die 6 moved downward, and then the substrate 1 is taken out and accommodated in an accommodating section (not shown). By accommodating the substrate 1, the process of bonding the semiconductor devices 3 is completed. In this action, even if pull force is applied to the bumps 3a while opening the dies 6 and 8, the electrical connection between the bumps 3a and the substrate 1 can be securely maintained. Therefore, connection reliability can be improved.

Embodiment 2

Next, the apparatus and the method of Embodiment 2 will be explained.

In comparison with Embodiment 1, the substrate holding plate 4 of the present embodiment has a different structure, and the semiconductor devices 3 are located on the lower side of the substrate 1. Other structural elements of the apparatus of Embodiment 2 are the same as those of Embodiment 1. Therefore, the structural elements described in Embodiment 1 are assigned the same symbols and explanation will be omitted. In the following description, unique structures of Embodiment 2 will be mainly explained.

Figure 4A:
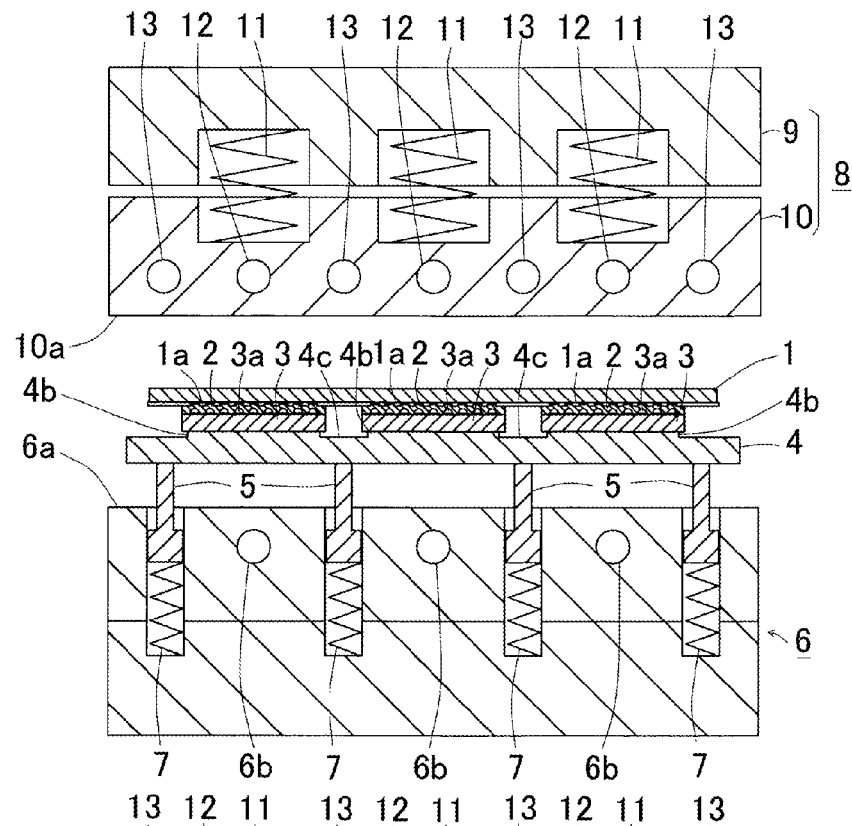
FIGS. 4A and 4B are sectional views of a bonding apparatus of Embodiment 2, in which a bonding step is performed.

In FIG. 4A, supporting sections 4b, whose planar size is slightly smaller than that of the semiconductor devices 3, are upwardly projected from the substrate holding plate 4. Therefore, in the substrate holding plate 4, grooves 4c are formed between the adjacent supporting sections 4b. Edges of the semiconductor devices 3 are not held by the supporting sections 4b, but widths of the edges are small so that they are not deformed by the press action. A distance between the adjacent supporting sections 4b is nearly equal to that of the adjacent semiconductor devices 3. When the substrate 1 is transferred onto the substrate holding plate 4, centers of the semiconductor devices 3 are corresponded to centers of the supporting sections 4b, and the supporting sections 4b support the semiconductor devices 3 in this state. Preferably, a thermal expansion coefficient of the substrate holding plate 4 is nearly equal to that of the substrate 1. For example, in case of using the ceramic substrate 1, a preferable material of the substrate holding plate 4 is ceramic or a material whose thermal expansion coefficient is equal to or nearly equal to ceramic.

Figure 4B:
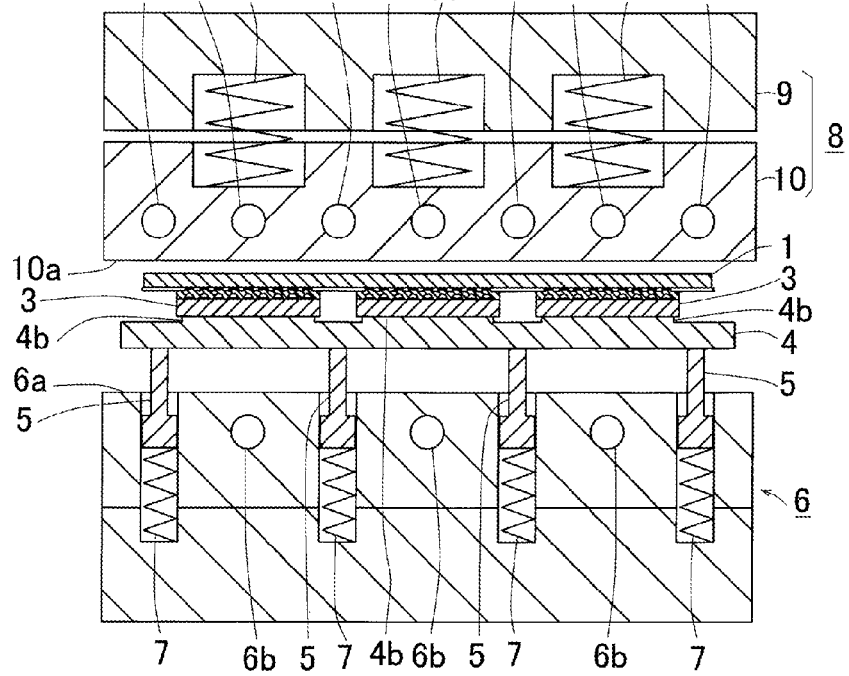

As shown in FIG. 4B, a rear face (an upper face) of the substrate 1 is moved close to the clamping face 10a of the upper die block 10 so as to preheat the substrate 1, etc. The substrate 1, the non-conductive adhesive 2, the semiconductor devices 3 and the substrate holding plate 4 are preheated from the rear face of the substrate 1 by radiation heat radiated from the clamping face 10a. By the preheat, the substrate 1 and the substrate holding plate 4, whose thermal expansion coefficients are nearly equal, are equally expanded. Therefore, the semiconductor devices 3 can follow displacement of the terminal sections 1a of the substrate 1, which is caused by the thermal expansion of the substrate 1. Therefore, displacement of the semiconductor devices 3 with respect to the substrate 1 can be prevented.

Figure 5A:
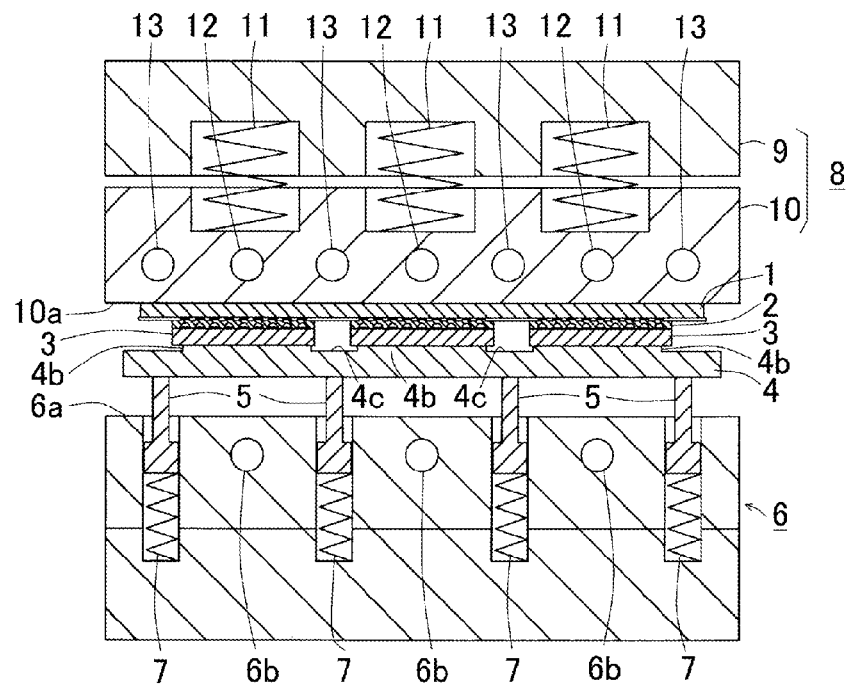
FIGS. 5A and 5B are sectional views of the bonding apparatus of Embodiment 2, in which the bonding step is performed.
Figure 5B:
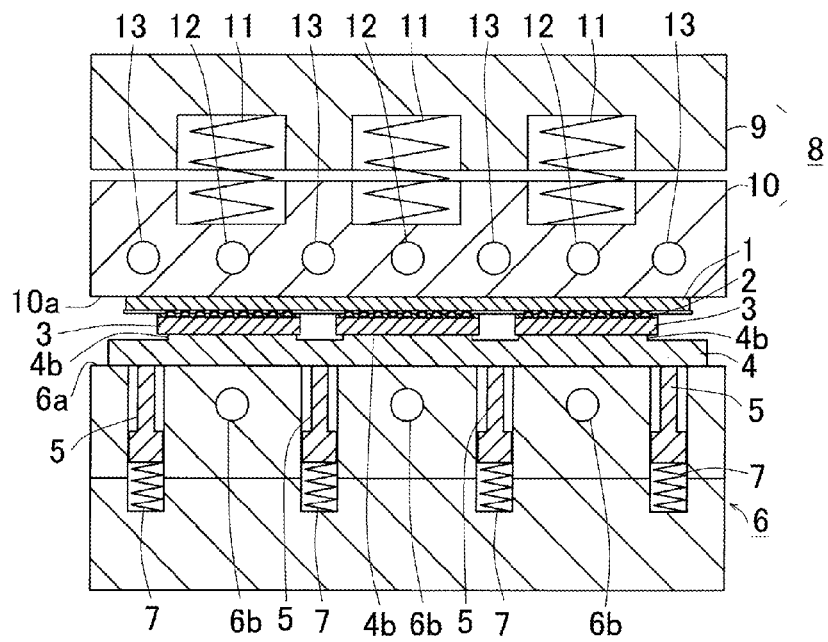

Next, as shown in FIG. 5A, the substrate 1 is pressed onto the clamping face 10a of the upper die block 10 so as to increase the temperature of the substrate 1. As described above, the thermal expansion coefficients of the substrate 1 and the substrate holding plate 4 are nearly equal. Therefore, even if the substrate 1 is expanded after being clamped, the clamped substrate 1 can be heated and pressed without displacing the semiconductor devices 3 mounted on the substrate holding plate 4 with respect to the substrate 1. Further, as shown in FIG. 5B, in case that the clamping face 6a of the lower die 6 contacts the substrate holding plate 4 to clamp the substrate 1 with great clamping force, the substrate 1 can be heated and pressed without displacing the semiconductor devices 3 with respect to the substrate 1 as well as the case shown in FIG. 5A. Therefore, even if the semiconductor devices 3 which are located on the lower side of the substrate 1 are mounted on the substrate holding plate 4, the bumps 3a can be securely electrically bonded to the terminal sections 1a of the substrate 1.

While performing this action, the melted non-conductive adhesive 2 will flow down via spaces between the substrate 1 and the semiconductor devices 3. If the substrate holding plate 4 is a flat plate having no supporting sections 4b, there is a possibility that the melted non-conductive adhesive 2 flows to the substrate holding plate 4 and invades into gaps between the substrate holding plate 4 and the semiconductor devices 3 by capillary phenomenon. If the non-conductive adhesive 2 invades into the gaps, flashes are formed on surfaces of the semiconductor devices 3, or the substrate holding plate 4 is contaminated and a cleaning operation is required.

In the present embodiment, the supporting sections 4b are upwardly projected from the upper face (the grooves 4c) and the planar size of the supporting sections 4b is smaller than that of the semiconductor devices 3, lower ends of side faces of the semiconductor devices 3 are separated from the substrate holding plate 4. Therefore, the flow of the melted non-conductive adhesive 2 is stopped at the lower ends of the side faces of the semiconductor devices 3 by surface tension. Since the non-conductive adhesive 2 is retained on the side faces of the semiconductor devices 3 without invading into the gaps between the semiconductor devices 3 and the substrate holding plate 4, the retained adhesive 2 becomes fillets so that the above described problems, which are caused by flowing the adhesive 2 downward, can be solved. The surplus adhesive 2 is collected and retained on the side faces of the semiconductor devices 3, widths of the fillets can be narrow, and a density of mounting the semiconductor devices 3 on the substrate 1 can be increased. Further, in case of using a substrate in which contamination of surface becomes a problem, e.g., semiconductor wafer, the contamination caused by the surplus adhesive can be securely prevented.

To prevent the contamination, the release film 14 may be fed between the semiconductor devices 3 and the substrate holding plate 4 before setting the substrate 1. In this case, a flat plate may be employed as the substrate holding plate 4. By performing the above described action with pressing the release film 14 by air, the flow of the non-conductive adhesive 2 can be prevented. In case that the non-conductive adhesive 2 does not flow down, the flat substrate holding plate 4 can be used without feeding the release film 14.

Further, even if the substrate 1 is heated and pressed in the clamped state, the semiconductor devices 3 never displace with respect to the substrate 1. Therefore, the heating and pressing the substrate 1, etc. can be started, without preheating the substrate 1, after setting the substrate 1, until reaching the prescribed temperature, so that throughput of the bonding operation can be improved.

Note that, in case of treating the work of Embodiment 1 in which the semiconductor devices 3 are adhered on the upper side of the substrate 1, a plate whose thermal expansion coefficient is nearly equal to that of the substrate 1 is provided above the semiconductor devices 3. The apparatus of the present embodiment can treat the work as well, and the same effects can be obtained. In this case, the plate expands, in the heating/pressing step, as well as the substrate 1. Therefore, displacement of the semiconductor devices 3 with respect to the substrate 1 can be prevented. The plate may be mounted on the semiconductor devices 3. Further, the plate may be provided on the substrate holding plate 4 and supported above the semiconductor devices 3, by suitable means, e.g., elastic member, until starting the press action.

Embodiment 3

Next, the apparatus and the method of Embodiment 3 will be explained with reference to FIGS. 6A-7B. Note that, the structural elements described in the above described embodiments are assigned the same symbols and explanation will be omitted.

In the present embodiment, the substrate 1 is accommodated in a closed space, which is closed by heating/pressing means and supporting means, a reduced-pressure atmosphere or a pressurized atmosphere is produced in the closed space, and then the semiconductor devices 3 are heated and pressed in the closed space.

As shown in FIG. 6A, a substrate holding plate 15 has an air path 15a and a plurality of sucking holes 15b, which are opened in a surface. An air tube 16a of a sucking mechanism 16, which is provided in a lower die block 19, is connected to the air path 15a. A stretchy spiral tube 16b is provided to a part of the air tube 16a. When the substrate holding plate 15 is pressed by the upper die 8, the spiral tube 16b absorbs a surplus of the air tube 16a. The sucking mechanism 16 is communicated to a sucking pump (not shown). A lower surface of the substrate 1, which is an opposite surface of a mounting surface (upper surface) on which the semiconductor devices 3 are adhered, is sucked by the sucking holes 15b, so that the substrate 1 is sucked and held by the substrate holding plate 15.

In a lower die 17, the lower die block 19 is supported by a lower die base 18, and the supporting rods 5 are provided in the lower die block 19 and floating-supported by the coil springs 7. A movable clamper 20, which encloses the lower die block 19, is supported by coil springs 21, which are elastically provided between the movable clamper 20 and the lower die base 18. An air path 22 is formed in the lower die base 18 and the lower die block 19.

A sealing member 23a, e.g., O-ring, is provided between the movable clamper 20 and side faces of the lower die block 19. A sealing member 23b, e.g., O-ring, is provided on a clamping face (upper face) 20a of the movable clamper 20. The release film 14 is sucked and held on the clamping face 10a of the upper die block 10. As shown in FIG. 6B, the clamping face 20a of the movable clamper 20 contacts the clamping face 10a of the upper die block 10, on which the release film 14 is held, when the lower die 17 is moved upward. By this action, a closed space K (see FIG. 6B) is formed between the upper die 8 and the lower die 17.

In FIG. 6A, the substrate holding plate 15 is supported by the supporting rods 5 and located at a position, at which upper faces of the semiconductor devices 3 are located lower than the clamping face 20a of the clamper 20, when the substrate 1 is set. Therefore, when the closed space K is formed, the clamping face 10a of the upper die block 10 is separated from the semiconductor devices 3, so that the preheating can be performed in the closed space K. A reduced-pressure atmosphere can be produced in the closed space K by discharging air therefrom via the air path 22, or a pressurized atmosphere can be produced in the closed space K by introducing compressed air thereinto via the air path 22. As shown in FIG. 6A, the coolers 6b and 12 are omitted, but they may be provided to the dies.

Next, the process of bonding the semiconductor devices will be explained.

In FIG. 6A, the upper die block 10 is heated by the heaters 13, and the release film 14 is sucked and held on the clamping face 10a of the upper die block 10. In this state, the substrate 1 is fed and set on the substrate holding plate 15. In this action, the dies 8 and 17 are opened and the substrate holding plate 15 is supported by the supporting rods 5 of the lower die 17. Next, the sucking mechanism 16 sucks air from the sucking holes 15b so as to suck and hold the substrate 1 on the upper face of the substrate holding plate 15. Even if the substrate 1 is originally bent or bent by being unevenly heated, the substrate 1 can be securely held on the substrate holding plate 15. Namely, the substrate 1 can be flatly held without being deformed or inclined. Therefore, the entire substrate 1 can be held parallel to the clamping face 10a, so that the substrate 1 can be uniformly heated and pressed.

Next, as shown in FIG. 6B, the lower die 17 is moved upward until the movable clamper 20 contacts the upper die block 10 so as to form the closed space K, and then air in the closed space K is discharged, via the air path 22, so as to reduce inner pressure of the closed space K. While performing this action, the semiconductor devices 3 are moved toward the clamping face 10a of the upper die block 10 so as to preheat the substrate 1 and the semiconductor devices 3 in the closed space K, until reaching the prescribed temperature, by radiation heat.

Next, as shown in FIG. 7A, the lower die 17 is further moved upward so as to press the semiconductor devices 3 onto the clamping face 10a of the upper die block 10, and the substrate 1 and the semiconductor devices 3 are heated and pressed, in the closed space K, until reaching the melting point of the bumps 3a.

While this heating and pressing action, the substrate 1 is clamped between the upper die block 10 and the substrate holding plate 15 by the spring force of the coil springs 7 of the lower die 17. The movable clamper 20 is moved downward, together with the upper die block 10, with compressing the coil springs 21.

Next, as shown in FIG. 7B, the lower die 17 is further moved upward, so that the supporting rods 5 are retracted into the lower die block 19 with compressing the coil springs 7. Therefore, the substrate holding plate 15 is moved until contacting the clamping face 19a of the lower die block 19, and the heating and pressing action is continued. In this action, the substrate 1 is still clamped between the upper die block 10 and the substrate holding plate 15.

The heating and pressing action is performed in the reduced-pressure atmosphere. Even if voids have been included in the non-conductive adhesive 2, the voids can be purged from the non-conductive adhesive 2 and the semiconductor devices 3 can be well underfilled. The substrate 1 is preheated to linearly expand before being clamped as well as the former embodiments, so that occurring position gaps, which are caused by thermal expansion of the substrate 1, can be prevented. The substrate 1 is floating-supported and can be heated in a short time, so that occurrence of poor connection can be prevented. Next, in FIG. 7B, the reduced-pressure state in the closed space K is released, and the dies 8 and 17 are opened. Then, the sucking mechanism 16 releases the substrate 1, and the substrate 1 is taken out and accommodated. By accommodating the substrate 1, the process of bonding the semiconductor devices 3 is completed.

According to types of the non-conductive adhesive 2, a property of adhering the semiconductor devices 3 can be maintained, without being badly influenced by voids, by performing the heating and pressing action in the reduced-pressure atmosphere.

On the other hand, the non-conductive adhesive 2 may cure in a pressurized atmosphere. Namely, the pressurized atmosphere is produced in the closed space K, and the preheating step and the bonding step are performed in the closed space K in which the pressurized atmosphere is produced. In this case, even if voids are included in the non-conductive adhesive 2, the voids are compressed and miniaturized so that the semiconductor devices 3 can be well underfilled. Further, the reduced-pressure atmosphere and the pressurized atmosphere may be alternately produced in the closed space K for performing the preheating step and the bonding step.

Embodiment 4

Next, the apparatus and the method of Embodiment 4 will be explained with reference to FIGS. 8A-9B. Note that, the structural elements described in the above described embodiments are assigned the same symbols and explanation will be omitted.

In the present embodiment, the closed space K is divided into a plurality of cavities, each of which corresponds to each of the semiconductor devices 3.

Figure 8A:
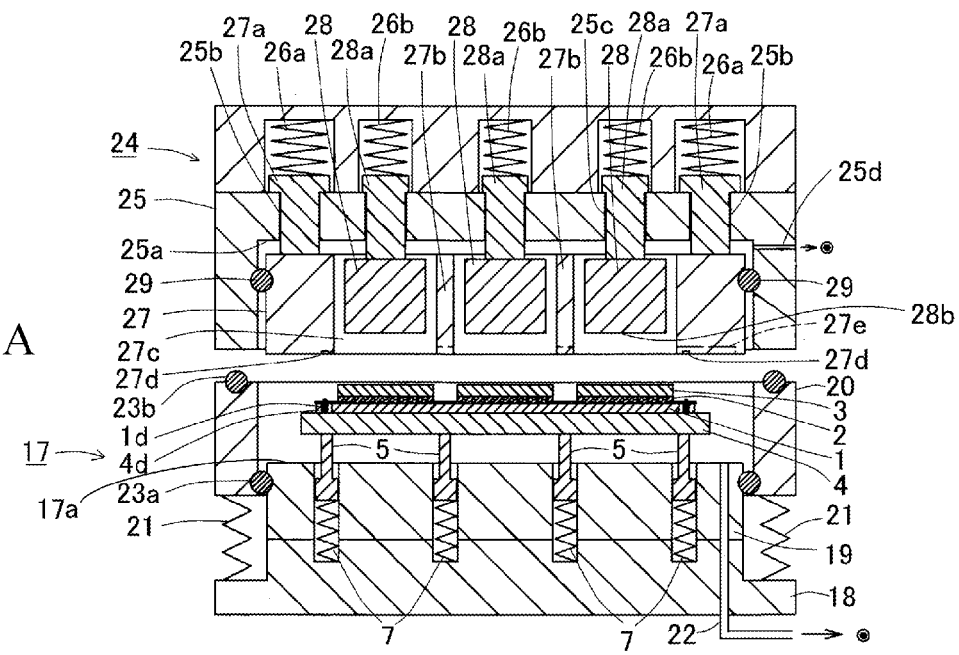
FIGS. 8A and 8B are sectional views of a bonding apparatus of Embodiment 4, in which a bonding step is performed.

In FIG. 8A, an upper die 24 has an upper die block 25, in which a concave section 25a is formed. A clamper 27 is suspended in the concave section 25a. An upper end of the clamper 27 is connected to guide rods 27a, each of which is suspended, from the upper die block 25, by a coil spring 26a. The guide rods 27a are respectively pierced through guide holes 25b formed in the upper die block 25. The clamper 27 is provided above the supporting rods 5 and capable of clamping the substrate 1 with the supporting rods 5. Lattice-shaped partitions 27b, which correspond to arrangement of the semiconductor devices 3, are formed in the clamper 27. The partitions 27b clamp the outer edges of the substrate 1 and parts of the substrate 1 each of which is located between the adjacent semiconductor devices 3. Since the closed space K is divided by the partitions 27b of the clamper 27, cavities 27c, each of which is capable of accommodating the semiconductor device 3, are formed. A presser 28 is provided in each of the cavities 27c. The pressers 28 are respectively connected to lower ends of guide rods 28a. The guide rods 28a are suspended, from the upper die block 25, by coil springs 26b. The guide rods 28a are respectively pierced through guide holes 25c formed in the upper die block 25.

To prevent invasion of the melted non-conductive adhesive 2 which is caused by capillary phenomenon, a planar size of the pressers 28 is made smaller than that of the semiconductor devices 3. The pressers 28 are heated by heaters (not shown) provided in the upper die block 25. As shown in FIG. 8A, in a normal state where the substrate 1 is not clamped, pressing faces (lower end faces) of the pressers 28 are located above the level of a lower end (clamping face) of the clamper 27. The height difference between the pressing face of the presser 28 and the clamping face of the clamper 27 is greater than a total thickness of the non-conductive adhesive 2 and the semiconductor device 3. Spring force of the coil springs 26a and 26b is greater than that of the coil springs 7. With this structure, the pressing faces of the pressers 28 are separated from the semiconductor devices 3 and the preheating can be performed until the substrate 1 is clamped by the clamping face 17a and the clamper 27.

The guide rods 28a of the pressers 28 are guided by the guide holes 25c, which are vertically bored in the upper die block 25, and the pressing faces of the pressers 28 can be moved with maintaining parallel to the clamping face of the clamper 27. Therefore, the pressers 28 are capable of pressing the semiconductor devices 3 onto the substrate 1 with uniform pressing force, so that each of the semiconductor devices 3 can be horizontally bonded without height variation.

Figure 8B:
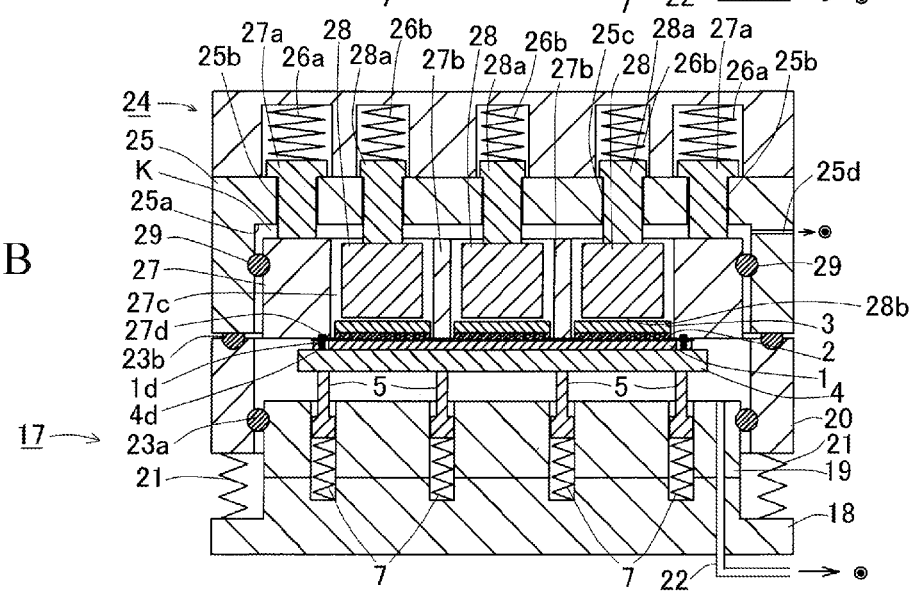

An air path 25d, which is communicated to, for example, a compressor (not shown), is formed in a side wall of the concave section 25a of the upper die block 25. A sealing member 29, e.g., O-ring, is provided between the clamper 27 and the concave section 25a so as to form the closed space K. When the substrate 1 is clamped as shown in FIG. 8B, the closed space K is formed by the substrate 1, the concave section 25a, the clamper 27 and the sealing member 29, so that inner pressure of the closed space K can be reduced.

Positioning pins 4d, which correspond to the outer edges of the substrate 1, are projected from the substrate holding plate 4. The positioning pins 4d are respectively pierced through substrate holes (through-holes) 1d of the substrate 1, so that the substrate 1 is correctly positioned and held by the substrate holding plate 4. Preferably, a plurality of the substrate holes 1d are elongate through-holes, which are elongated in a direction of a center line of the substrate 1. With this structure, the substrate 1 can be securely set at a predetermined position on the substrate holding plate 4, and the semiconductor devices 3 can be suitably positioned with respect to the pressing faces of the pressers 28. On the other hand, positioning holes 27d, into which upper ends of the positioning pins 4d can fit, are formed in the lower end face of the clamper 27. When the dies 17 and 24 are closed as shown in FIG. 8B, the positioning pins 4d respectively fit into the positioning holes 27d, and the substrate 1 is clamped by the clamper 27.

Next, the process of bonding the semiconductor devices 3 will be explained.

In FIG. 8A, the substrate 1, on which the semiconductor devices 3 have been adhered, is set on the substrate holding plate 4, which is provided in the opened lower die 17, and the positioning pins 4d respectively fit into the positioning holes 1d.

Next, the lower die 17 is moved upward until the clamper 27 contacts the substrate 1 to form the closed space K as shown in FIG. 8B. Then, air is discharged from the closed space K via the air path 25d, so that the reduced-pressure atmosphere is produced in the closed space K. In this action, the semiconductor devices 3 are moved close to the pressing faces of the pressers 28. Therefore, the substrate 1 and the semiconductor devices 3 are preheated, in the reduced-pressure atmosphere, by radiation heat from the pressing faces heated by the heaters (not shown), until reaching the prescribed temperature, so that the substrate 1 is thermally expanded. By moving the lower die 17 upward, the sealing member 23b provided on the clamping face of the movable clamper 20 contacts the upper die block 25.

Note that, the substrate 1 is clamped in the state where the positioning pins 4d fit in the positioning holes 27d, but the clamping force is generated by the coil springs 7 only. So, the substrate 1 can thermally expand. In the present embodiment, the substrate holes 1d are elongate holes extended in the direction of the center line of the substrate 1. Therefore, even if the substrate 1 thermally expands, deformation of the substrate 1 is not limited and no stress is applied thereto.

Figure 9A:
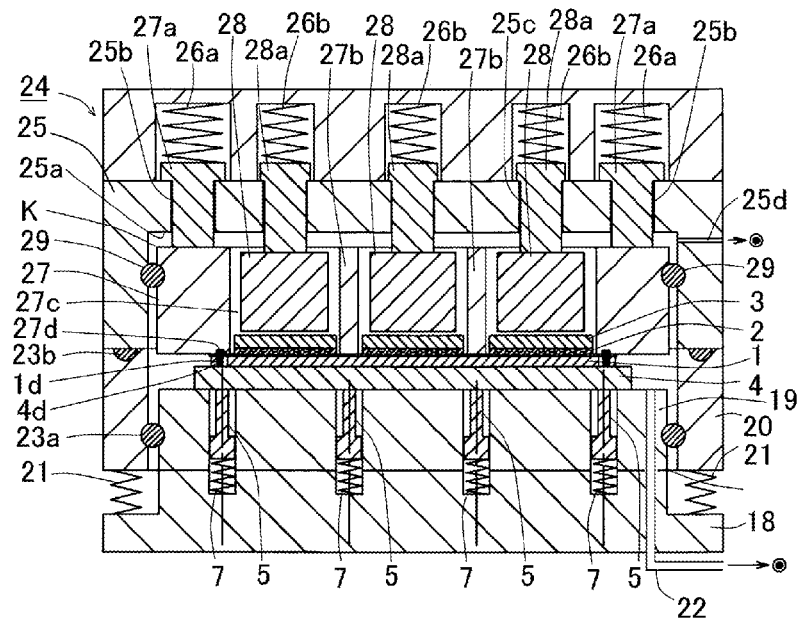
FIGS. 9A and 9B are sectional views of the bonding apparatus of Embodiment 4, in which the bonding step is performed.

Next, as shown in FIG. 9A, the lower die 17 is further moved upward, so that the supporting rods 5 compress the coil springs 7 and the supporting rods 5 are retracted into the lower die block 19. In this action, the movable clamper 20 contacts the upper die block 25 with the sealing member 23b, so that the movable clamper 20 is moved downward. Since the pressing face of the presser 28 can be maintained parallel to the clamping face of the clamper 27 while moving the presser 28, the entire surface of each semiconductor device 3 can be uniformly separated from the pressing face of the presser 28. Therefore, the entire surface of each semiconductor device 3 can be uniformly heated, so that the non-conductive adhesive 2 can cure uniformly. Further, the bumps 3a can be uniformly heated.

Figure 9B:
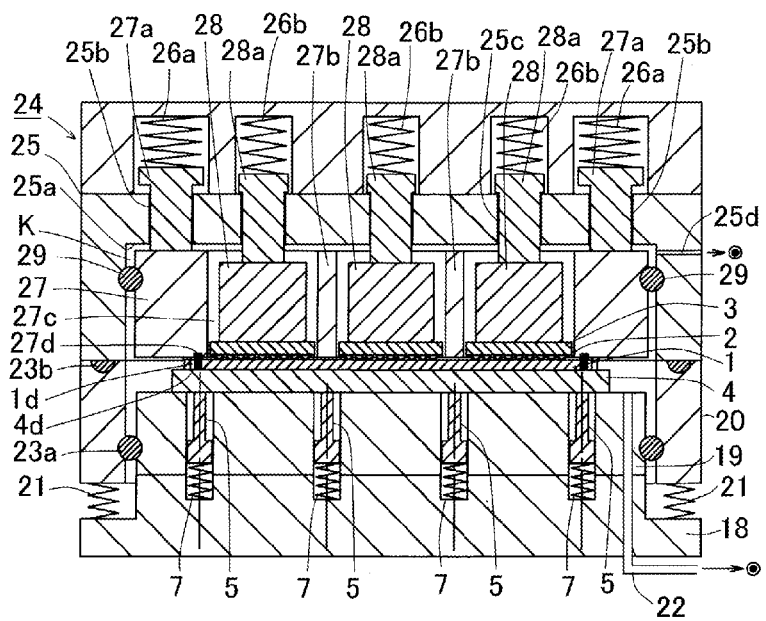

Next, as shown in FIG. 9B, the lower die 17 is further moved upward so as to press the semiconductor devices 3 onto the pressing faces of the pressers 28, and the semiconductor devices 3 are heated until reaching the melting point of the bumps 3a. In this case, the clamper 27 and the pressers 28 are pressed onto the lower die 17, with the substrate 1, by the upward movement of the lower die 17, so that the coil springs 26a and 26b are compressed. In this action, the substrate 1, etc. are clamped by the spring force of the coil springs 26a and 26b. Therefore, even if the substrate 1 thermally expands, the substrate 1 can be securely held without flopping. Further, the entire surface of each semiconductor device 3 is heated and pressed in the horizontal state without height variation, so that each semiconductor 3 can be securely bonded by the non-conductive adhesive 2.

As described above, the semiconductor devices 3 are respectively pressed by the pressers 28. Even if heights of the semiconductor devices 3 from the substrate 1 are different, the differences can be absorbed by the coil springs 26b so that the semiconductor devices 3 can be securely bonded.

Note that, the means for pressing the clamper 27 and the pressers 28 is not limited to the coil springs 26b. For example, air springs, elastic members, etc. may be employed. Further, a suitable drive mechanism, e.g., hydraulic cylinder, motor, which is capable of vertically driving the clamper 27 and the pressers 28 and linking with the vertical movement of the lower die 17, may be employed.

In case that the pressurized atmosphere is produced in the closed space K shown in FIG. 8B, compressed air is introduced into the closed space K, via the air path 25d of the upper die 24 and the air path 22 of the lower die 17 so as to press the substrate 1, from above and below, by the air. With this structure, the pressurized atmosphere can be produced in the cavities 27c, and the preheating and the bonding steps can be performed in the cavities 27c without bending the substrate 1.

In case of using the release film 14, a communication groove 27e, which is indicated, in FIG. 8A, by dotted line, is formed. The communication groove 27e is formed in the clamping face of the clamper 27. The cavities 27c are mutually communicated by the communication groove 27e, and the communication groove 27e is communicated to the outside via the cavities 27c. Therefore, even if the release film 14 is held on the clamping face of the upper die 24, air can be flown via the communication groove 27e, so that the pressure can be reduced or increased through the air path 22 (see FIG. 6A) of the lower die 17. Note that, in case of pressing by air, the release film 14 must be pressed from above by introducing compressed air via the air path 25d of the upper die 24. As described above, even if the closed space K is divided into the cavities 27c, the semiconductor devices 3 can be heated and pressed, in the reduced-pressure atmosphere or the pressurized atmosphere, with using the release film 14.

Embodiment 5

Next, the apparatus and the method of Embodiment 5 will be explained with reference to FIGS. 10A and 10B. Note that, the structural elements described in the above described embodiments are assigned the same symbols and explanation will be omitted.

In the present embodiment, the upper die (first die) 8 includes the upper die block 10, which has the built-in heaters 13 and stopper blocks 30 provided on the clamping face 10a; the lower die (second die) 6 includes stopper blocks 31 provided on the clamping face 6a. A height of each of the stopper blocks 30 and 31 is equal to a total thickness of "the heated and pressed substrate 1 including the semiconductor devices 3 and the non-conductive adhesive 2" plus "the substrate holding plate 4".

Figure 10A:
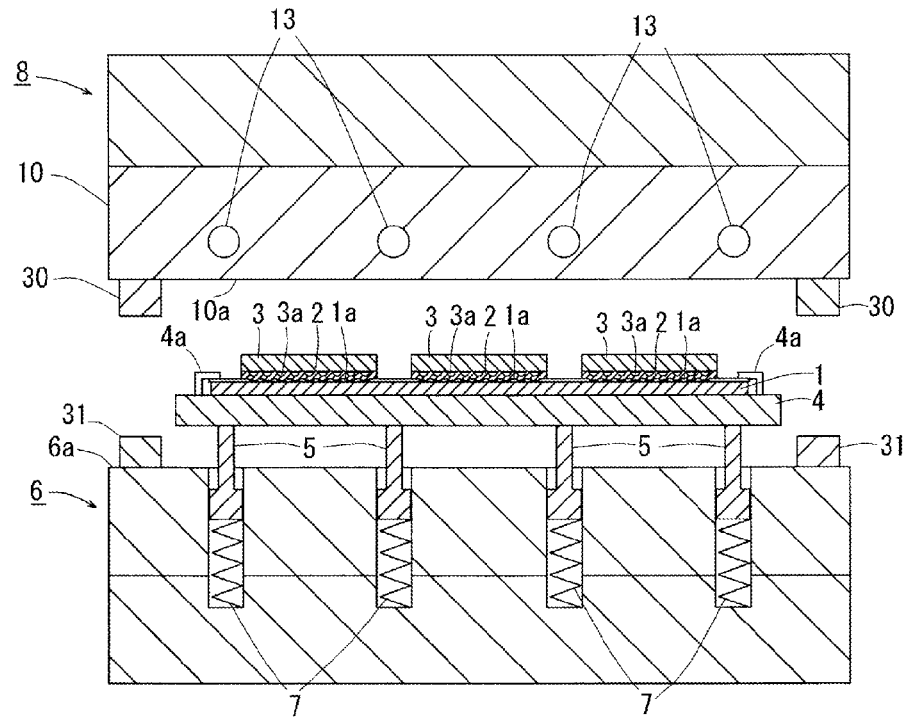
FIGS. 10A and 10B are sectional views of a bonding apparatus of Embodiment 5, in which a bonding step is performed.
Figure 10B:
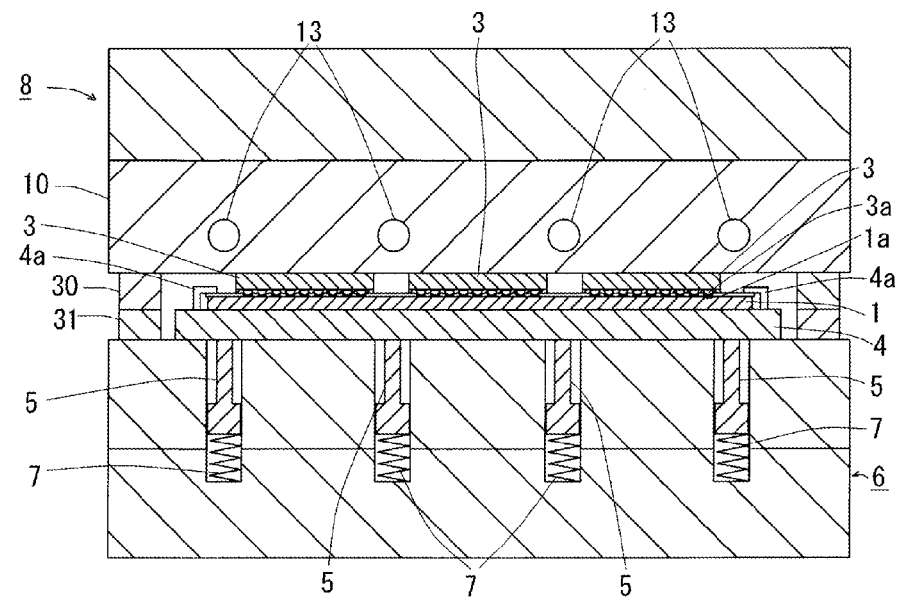

As shown in FIG. 10A, the substrate 1 is set on the substrate holding plate 4, and the edges of the substrate 1 are held by the chucks 4a.

Next, in FIG. 10A, the lower die 6 is moved upward to move the semiconductor devices 3 toward the clamping face 10a of the upper die block 10a. In this state, the substrate 1 and the semiconductor devices 3 are preheated until reaching the prescribed temperature, and then the lower die 6 is further moved upward as shown in FIG. 10B. Therefore, semiconductor devices 3 are pressed onto the clamping face 10a of the upper die block 10 and heated, in this state, until reaching the melting point of the bumps 3a.

By closing the dies 6 and 8 until the stopper blocks 30 and 31 contact each other, the semiconductor devices 3, which have been mounted on the substrate 1 held by the substrate holding plate 4, is clamped between the upper die block 10 and the substrate holding plate 4. The semiconductor devices 3 are heated and pressed in this state.

By heating and pressing the semiconductor devices 3 with stopping levels of the dies, the semiconductor devices 3 can be uniformly bonded. In this case, a clearance for clamping can be easily adjusted by changing heights of the stopper blocks 30 and 31. Therefore, even if thicknesses of the substrate 1, etc. are changed, the apparatus can deal with the change easily. Note that, the stopper blocks 30 and 31 need not be provided to both of the dies 6 and 8. The stopper blocks may be provided one of the dies 6 and 8. Further, mechanisms for adjusting the heights of the stopper blocks 30 and 31 may be provided so as to deal with the change of the thickness of the substrate 1. The stopper blocks 30 and 31 may be provided to an upper platen (not shown), to which the upper die 8 is attached, and a lower platen (not shown), to which the lower die 6 is attached. In this case, it is hard to conduct the heat of the heaters 13 to the stopper blocks 30 and 30, so that the heights of the stopper blocks 30 and 31 can be maintained without thermal expansion.

In the above described embodiments, the lower die is moved upward and downward, but the upper die may be moved upward and downward. Further, the upper and lower dies may be moved upward and downward.

Figure 11:
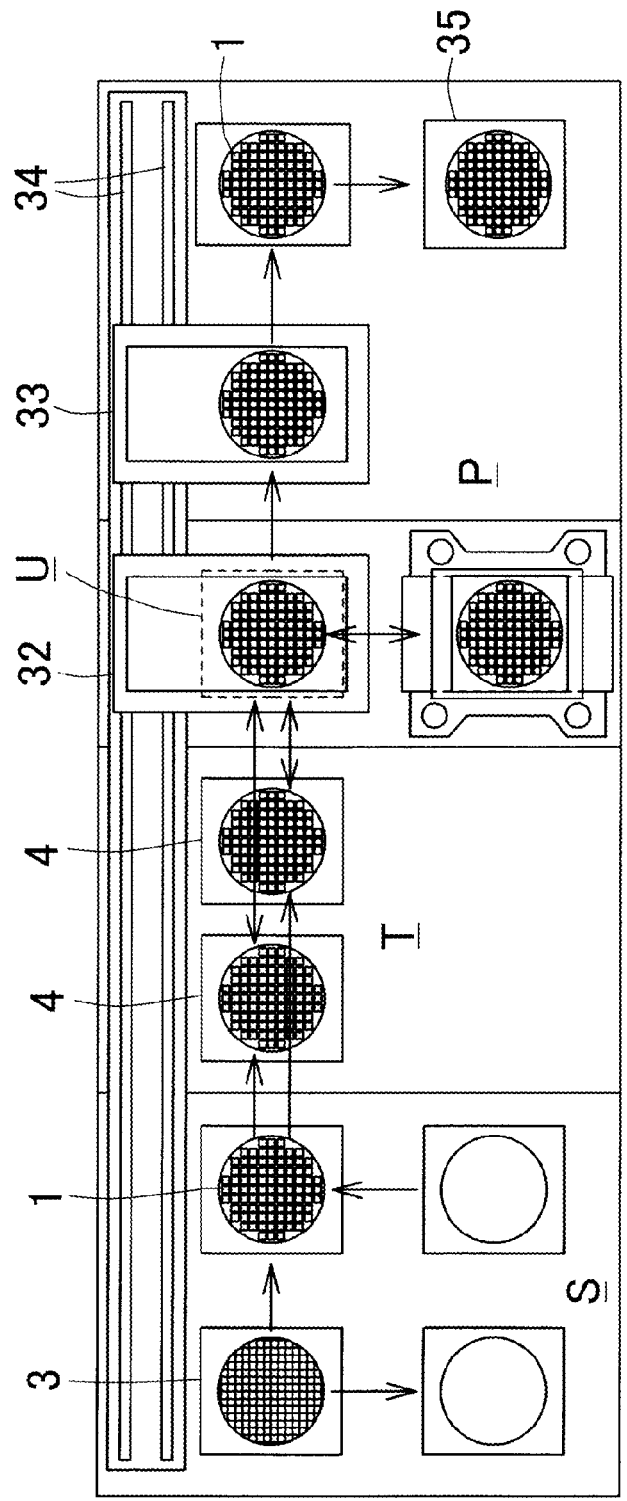
FIG. 11 is a plan view of the bonding apparatus showing layout thereof.

FIG. 11 is a plan view showing layout of the bonding apparatus. The layout may be applied to the bonding apparatuses of Embodiments 1-5. Note that, the apparatus shown in FIG. 11 transfers the substrate holding plate 4, and a semiconductor wafer (substrate) 1, on which cable patterns are formed and semiconductor devices are mounted, is held by the substrate holding plate 4. The bonding apparatus comprises: a loader 32 for conveying the substrate to a press section (pressure bonding section) P; an unloader 33 for taking out and accommodating the substrate on which the semiconductor devices have been bonded; and a common rail 34 for guiding the loader 32 and the unloader 33.

In a substrate feeding section S, the semiconductor devices 3, which are semiconductor chips produced by dicing a semiconductor wafer, are adhered on the substrate (semiconductor wafer) 1, on which no semiconductor devices have been adhered. Preferably, the adhering step is performed in a vacuum atmosphere so as to prevent voids from being formed in the non-conductive adhesive 2. The loader 32 receives the substrate 1, on which the semiconductor devices 3 have been adhered, from the substrate feeding section S and transfers onto the substrate holding plate 4, which has waited on a plate feeding stage T. Next, the loader 32 conveys the substrate holding plate 4, on which the substrate 1 is mounted, to the press section P. In the press section P, the semiconductor devices 3 are bonded to the substrate 1 by the bonding method described in each of Embodiments 1-5. The loader 32 takes out the substrate holding plate 4, which has been heated and pressed, from the press section P and transfers the same to a stage U. Next, the unloader 33 receives the substrate 1 from the stage U and conveys the same to an accommodating section 35. The substrate holding plate 4 left on the stage U is returned to the plate feeding stage T, by the loader 32, and cooled.

In the present embodiment, a plurality of the plate feeding stages T are provided, so a plurality of the substrate holding plates 4 are cooled outside of the press section P for reuse. Since the substrate 1 is set on the cooled substrate holding plate 4 and conveyed to the press section P, the substrate 1 can be rapidly heated and the non-conductive adhesive 2 never cures before heating and pressing the substrate 1. The two substrate holding plates 4 can be alternately used, so that one of the substrate holding plates 4 can be cooled and the substrate 1 can be set thereon while the other substrate holding plate 4 is used for performing the bonding step. Therefore, no waiting time for cooling and setting the substrate holding plate 4 is required, so that production efficiency can be improved. Note that, the substrate 1, on which the semiconductor devices 3 have been adhered, may be supplied from outside of the bonding apparatus.

The apparatus and the method of the preferred embodiments have described, but the present invention is not limited to the above described embodiments. The supporting rods 5 are not located immediately under the semiconductor devices 3, but the present invention is not limited to this structure. For example, the supporting rods 5, whose number is equal to that of the semiconductor devices 3, may be floating-supported by the coil springs 7, and the supporting rods 5 may be provided immediately under the semiconductor devices 3 so as to support the substrate holding plate 4. In this case, the pressing force for pressing the semiconductor devices 3 can be adjusted by adjusting the spring force of the coil springs 7. By uniformly adjusting the spring force of the coil springs 7, the semiconductor devices 3 can be uniformly pressed. A rod supporting plate, on which the supporting rods 5 are erected, may be provided in the lower die 6. In this case, by supporting the rod supporting plate with the coil springs 7, projection lengths of the supporting rods 5 can be equalized.

The structures of the upper die 8 and the lower die 6 may be inverted. For example, the substrate holding plate 4 holding the substrate 1 may be suspended from the lower face of the upper die, and the heaters may be provided in the lower die. In this case, preferably, a shield plate is set between the substrate holding plate 4 and the heaters of the lower die so as to shield the radiation heat until the preheating begins, so that heating the substrate 1 can be prevented. Note that, the shield plate may be used, for shielding the radiation heat, in the above described embodiments. Peltier elements may be provided in the substrate holding plate 4 so as to maintain the cooled state until beginning the pressing step. In this case, the problem of curing the non-conductive adhesive 2 early by the radiation heat can be securely prevented. In case that the substrate holding plate 4 is omitted and the supporting rods 5 directly support the substrate 1, flange sections may be provided to upper ends of the supporting rods 5 so as to broaden supporting areas (contact areas).

In Embodiments 3-5 too, the substrate 1 to be heated and pressed may be inverted as well as Embodiment 2. Suitable means (e.g., chucks, sucking mechanism, positioning pins, electrostatic chucks) may be employed as means for holding and positioning the substrate 1. In the above described embodiments except Embodiment 1, the bonding step may be completed in the state, where the substrate holding plate 4 or 15 is clamped by clamp force applied by the coil springs 7, before the substrate holding plate 4 or 15 contacts the clamping face 6a of the lower die 6. In case of using the substrate 1 whose thermal expansion coefficient is great, e.g., organic substrate, it is preferable to perform the preheating step after stopping the die-closing action. On the other hand, in some cases where the substrate 1, e.g., semiconductor wafer, has a small thermal coefficient, a time for the preheating step may be shortened, so the preheating step can be performed without closing the dies.

The supporting rods 5 are used as the supporting means. Further, in case that thermal resistance of the member on which the substrate 1 is set is great and the temperature of the substrate 1 can be efficiently increased, other supporting means can be employed. For example, lattice-shaped grooves may be formed in the clamping face 6a of the lower die 6, and lattice-shaped supporting members, which can be inserted into the lattice-shaped grooves, may be used as the supporting means for supporting the substrate holding plate 4 or 15. In this case, the supporting members may support the parts of the substrate immediately under the semiconductor devices 3 or other parts thereof. With this structure, the substrate 1 can be horizontally held without height variation.

The structure for supporting the substrate holding plate 4 or 15 by the coil springs 7 has been described. In the present invention, the substrate holding plate 4 or 15 may be supported by other means. For example, air spring or other elastic members may be employed. The elastic member may be omitted, and a suitable vertical drive mechanism, e.g., hydraulic cylinder, motor, which is capable of linking with the vertical movement of the lower die 6, may be employed. For example, the drive mechanism is controlled to make the substrate holding plate 4 or 15 separate a prescribed distance from the clamping faces 6a and 10a while performing the preheating step. On the other hand, while performing the heating and pressing step, the drive mechanism is controlled to maintain a certain distance between the clamping face 10a and the substrate holding plate 4 or 15 clamped. With this control, the pressing force can be precisely controlled, so that the semiconductor devices 3 can be well underfilled.

In the above described embodiments, the supporting rods 5 are floating-supported by the coil springs 7 provided in the lower die 6. However, other supporting means may be employed as far as the work can be pressed onto the heating/pressing means. For example, the supporting rods 5 may be moved upward and downward by a suitable driving mechanism, e.g., air cylinder, hydraulic cylinder, motor. In this case, the supporting rods 5 may be fixed to a rod supporting plate and integrally moved upward and downward. By respectively moving the supporting rods upward and downward according to flexure, inclination and swell of the work, an upper face of the work can be horizontally set, without height variation, so that the work can be uniformly pressed without reference to the shape of the work. Note that, the supporting means is not limited to the rod. Other means having a small sectional area and being capable of adiabatically supporting the substrate 1 may be employed as the supporting means.

Embodiment 6

Next, the apparatus and the method of Embodiment 6 will be explained. Note that, the structural elements described in the above described embodiments are assigned the same symbols and explanation will be omitted.

Figure 19:
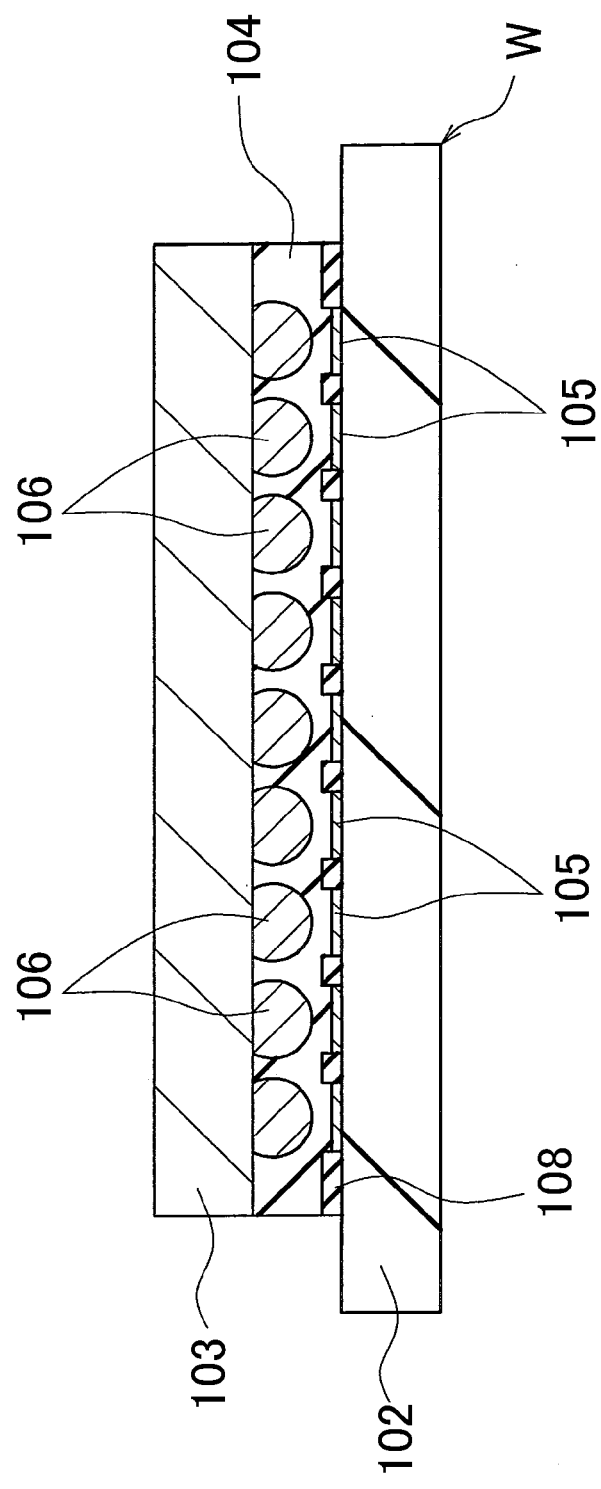
FIG. 19 is a schematic sectional view of a semiconductor device in the bonding step.
Figure 21:
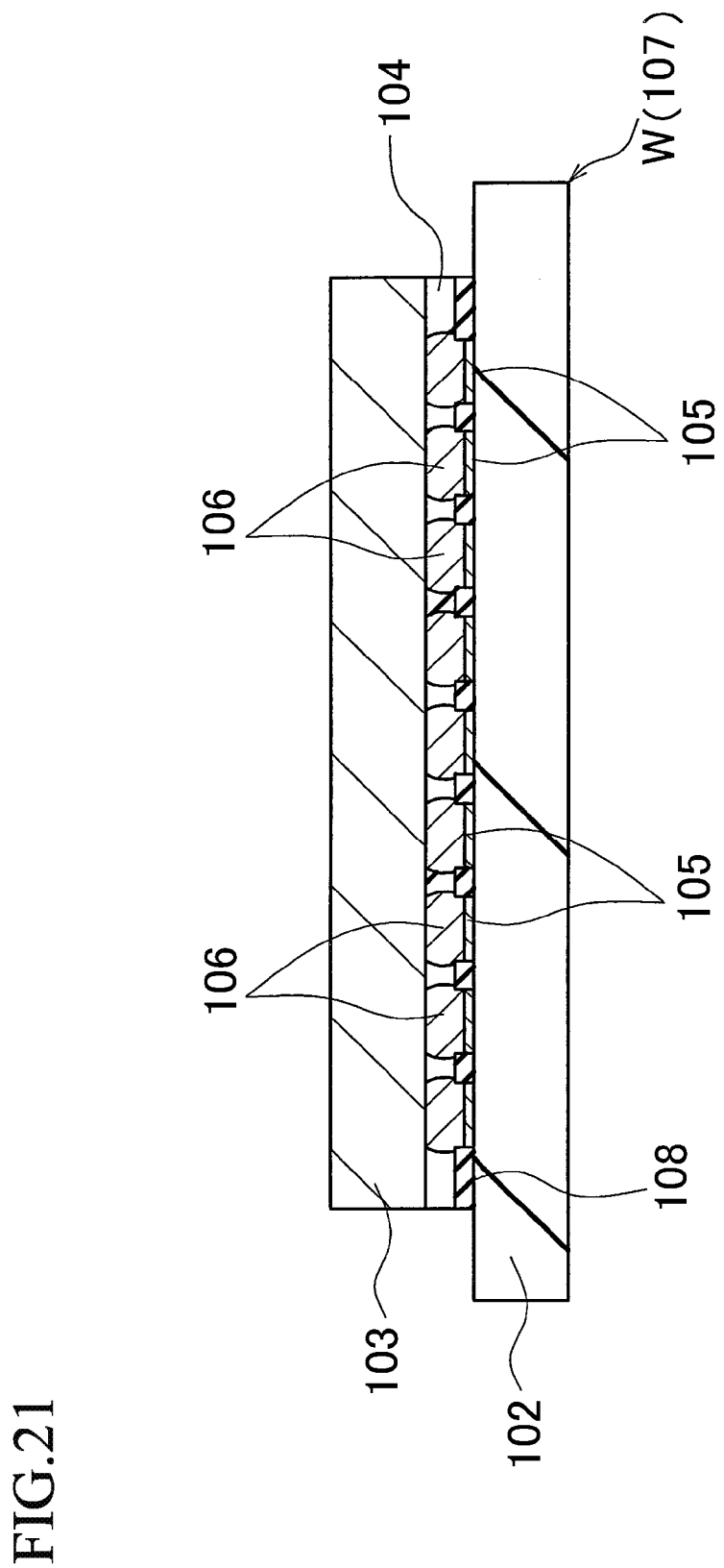
FIG. 21 is a schematic sectional view of the semiconductor device showing a step following the step shown FIG. 20.

In the present embodiment, the bonding apparatus bonds laminated members of a work W, which are laminated with an adhesive layer, with clamping the work between an upper die and a lower die. The work W before being clamped is shown in FIG. 19; the work W being clamped is shown in FIG. 21. In the work W shown in FIG. 19, an electronic component 103 is temporarily bonded (adhered) to a circuit board 102 with an adhesive layer 104, which is composed of, for example, NCF or NCP. In the work W, a plurality of connection pads, e.g., copper pads, 105, which are exposed from an insulating layer 108, are respectively corresponded to connection bumps, e.g., solder bumps, 106. In the work W shown in FIG. 21, the connection bumps 106 of the electronic component 103 are respectively electrically bonded to the connection pads 105 of the circuit board 102, and the electronic component 103 is flip-chip-bonded to the circuit board 102 with the adhesive layer 104.

Next, a bonding apparatus 101A of the present embodiment will be explained with reference to FIG. 12, etc. The bonding apparatus 101A produces a semiconductor device 107 (see FIG. 21), in which a plurality of electronic components 103 are electrically bonded to the circuit board 102.

The bonding apparatus 101A has an upper die 111 and a lower die 112, which are vertically arranged to clamp the work W. In the present embodiment, the upper die 111 is fixed to a center of a movable platen (not shown); the lower die 112 is fixed to a center of a fixed platen (not shown). Outer edge parts of the fixed platen and outer edge parts of the movable platen are connected by tie bars (not shown). The fixed platen is fixed to the tie bars, and the movable platen is capable of moving, upward and downward, on the tie bars. The movable platen is driven by a known vertical driving mechanism (not shown), e.g., a ball bearing screw driven by an electric motor.

By moving the movable platen away from the fixed platen, the dies 111 and 112 are separated and opened. In this state, the work W is set on the lower die 112 (see FIG. 12). On the other hand, by moving the upper die 111 toward the lower die 112 and closing the dies 111 and 112, a closed space (chamber) 131 is formed and the work W is accommodated therein (see FIG. 14). Note that, the upper die 111 may be fixed to the fixed platen, the lower die 112 may be fixed to the movable platen and the lower die 112 may be vertically moved with respect to the upper die 111.

The bonding apparatus 101A further comprises: a supporting mechanism 110, a heating/pressing mechanism 113; a sealing mechanism 114 and a pressure adjusting mechanism 115. The supporting mechanism 110 floating-supports the work W, which is set between the upper die 111 and the lower die 112. The sealing mechanism 114 seals the closed space 131 accommodating the clamped work W. The pressure adjusting mechanism 115 increases inner pressure of the closed space 131 sealed by the sealing mechanism 114. The supporting mechanism 110, the heating/pressing mechanism 113 and the sealing mechanism 114 are constituted by the upper die 111 and the lower die 112. The pressure adjusting mechanism 115 is located outside of the dies 111 and 112.

Firstly, the heating/pressing mechanism 113 will be explained. As shown in FIG. 12, the upper die 111 has an upper heating/pressing section (a first heating/pressing section) 116, which faces the lower die 112 and heats and presses the work W. The lower die 112 has a lower heating/pressing section (a second heating/pressing section) 117, which faces the upper die 111 and heats and presses the work W. Namely, in the heating/pressing mechanism 113, the upper heating/pressing section 116 and the lower heating/pressing section 117, which respectively generate heat, are moved close to each other so as to heat and press the work W.

The upper heating/pressing section 116 is a block composed of, for example, alloy tool steel, and has a plurality of built-in heaters 118 as heat sources. The lower heating/pressing section 117 is a block composed of, for example, alloy tool steel, and has a plurality of built-in heaters 119 as heat sources. The work W is clamped and heated by the upper heating/pressing section 116, which is heated by the heaters 118, and the lower heating/pressing section 117, which is heated by the heaters 119. By moving the lower heating/pressing section 117 toward the upper heating/pressing section 116, the work W located between the upper heating/pressing section 116 and the lower heating/pressing section 117 are clamped and pressed by the heating/pressing sections 116 and 117 (see FIG. 14).

Figure 12:
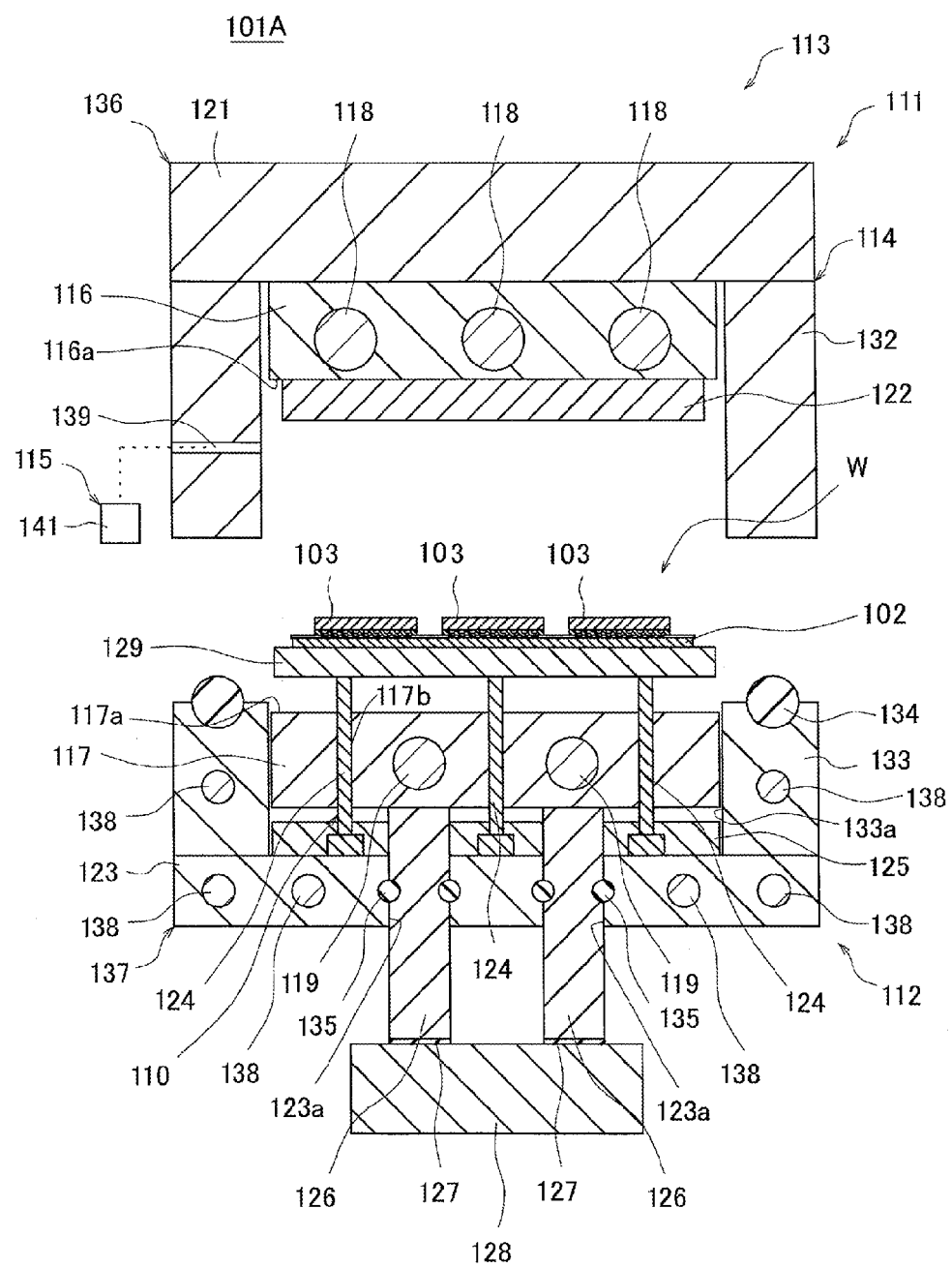
FIG. 12 includes sectional views of a bonding apparatus of Embodiment 6 in operation.

To improve heating function of the heaters 118 and 119, the heaters 118 and 119 are provided in the upper heating/pressing section 116 and the lower heating/pressing section 117 and elongated in the direction perpendicular to the paper surface of the drawing of FIG. 12. Heating properties of the heaters 118 and 119 are set on the basis of heat capacities of the structural members constituting the upper heating/pressing section 116, the lower heating/pressing section 117, etc. It is necessary to heat the clamped work W until reaching the melting point of the connection bumps (e.g., solder bumps) 106 of the electronic component 103 (see FIG. 21) and the curing temperature of the adhesive layer (e.g., NCF, NCP) 104. For example, the melting point of solder is about 250-260° C. The NCF or NCP is cured by heating at the curing temperature (about 200-260° C.) for a prescribed time.

The upper heating/pressing section 116 and the lower heating/pressing section 117 act as clamping sections (pressing means) for clamping the work W. Therefore, a lower face of the upper heating/pressing section 116 acts as a clamping face 116a, and an upper face of the lower heating/pressing section 117 acts as a clamping face 117a.

In the upper die 111, an upper base 121, which is composed of, for example, alloy tool steel, is fixed to the movable platen (not shown). The upper heating/pressing section 116 is fixed on a lower face of the upper base 121. A fixed spacer section 122, which is composed of, for example, alloy tool steel, is fixed on the clamping face 116a of the upper heating/pressing section 116. A thickness of the fixed spacer section 122 is adjusted according to a thickness of the work W so as to suitably clamp the work W between the upper heating/pressing section 116 and the lower heating/pressing section 117. In some cases, no fixed spacer section 122 is required according to the thickness of the work W.

In the lower die 112, a lower base 123, which is composed of, for example, alloy tool steel, is fixed to the fixed platen (not shown). A plurality of supporting pins (supporting sections) 124, which are composed of, for example, alloy tool steel, are erected upward from the lower base 123. Preferably, the supporting pins 124 are composed of a material having low heat conductivity, e.g., ceramic, heat resistance glass, so as to restrain heat conduction from the lower die 112 to the work W via the supporting pins 124.

Through-holes 123*a*, through which the supporting pins 124 pass, are formed in the lower base 123. Intervals between the supporting pins 124 are determined according to a size of the work W. Lower ends of the supporting pins 124 are securely fixed to a retainer 125, which is composed of, for example, alloy tool steel, so as not to disconnect therefrom. The supporting pins 124 have the same length, and the work W is supported by upper ends of the supporting pins 124.

The lower heating/pressing section 117 is provided above the lower base 123 and capable of moving upward and downward in the lower die 112. A plurality of through-holes 117*b* are formed in the lower heating/pressing section 117. The supporting pins 124 are respectively pierced through the through-holes 117*b* of the lower heating/pressing section 117. With this structure, when the lower heating/pressing section 117 is moved upward and downward, the supporting pins 124 slide on inner faces of the through-holes 117*b*. Preferably, thermal expansion coefficients of the lower heating/pressing section 117 and the retainer 125 are equal. Therefore, even if the lower heating/pressing section 117 and the retainer 125 thermally expand, the supporting pins 124 can smoothly slide on the inner faces. Note that, if an inner diameter of the through-holes 117*b* is sufficiently greater than an outer diameter of the supporting pins 124, the lower heating/pressing section 117 and the retainer 125 may have different thermal expansion coefficients.

A plurality of supporting rods 126 are composed of, for example, alloy tool steel. Upper ends of the supporting rods 126 are fixed to the lower heating/pressing section 117 so as to support the lower heating/pressing section 117. Through-holes 123*a* are formed in the lower base 123 and the retainer 125, which is fixed on the lower base 123, with a prescribed interval. The supporting rods 126 are respectively pierced through the through-holes 123*a*. Lower ends of the supporting rods 126 are fixed to an elevating section 128, which is composed of, for example, alloy tool steel, with insulation members 127. The elevating section 128 is linked to a vertical driving mechanism (not shown). By actuating the vertical driving mechanism, the supporting rods 126, which are erected upward from the elevating section 128, move the lower heating/pressing section 117 upward and downward. When the lower heating/pressing section 117 is moved upward and downward, the supporting rods 126 slide on inner faces of the through-holes 123*a*, which are formed in the lower base 123 and the retainer 125.

By floating-supporting the lower heating/pressing section 117 with the supporting rods 126, the heat of the lower heating/pressing section 117 is not easily conducted to the elevating section 128. By providing the insulation members 127 between the supporting rods 126 and the elevating section 128, the heat conduction can be further restrained.

Next, the supporting mechanism 110 of the bonding apparatus 101A will be explained. As shown in FIG. 12, the supporting pins 124, which are vertically pierced through the lower heating/pressing section 117, are provided to the lower die 112. By moving the lower heating/pressing section 117 upward, the supporting pins 124 are retracted into the clamping face 117*a* (see FIG. 14). On the other hand, by moving the lower heating/pressing section 117 downward, the supporting pins 124 are projected from the clamping face 117*a* (see FIG. 13).

For example, a matrix of the supporting pins 124 are provided on the lower base 123 and support a supporting plate 129, on which the work W is set. Namely, the lower die 112 has the supporting plate 129, which are provided above the lower heating/pressing section 117 and the supporting pins 124, so as to support the work W. The supporting pins 124 are equally spaced, so that the supporting plate 129 is not bent by its own weight and can be horizontally supported without height variation. By supporting the work W with using the supporting plate 129, the work W can be supported parallel to the upper heating/pressing section 116 (fixed spacer section 122) when the work W is clamped. Note that, in case of treating a rigid and undeformable work, e.g., ceramic substrate, as the circuit board 102, the supporting plate 129 may be omitted.

Figure 13:
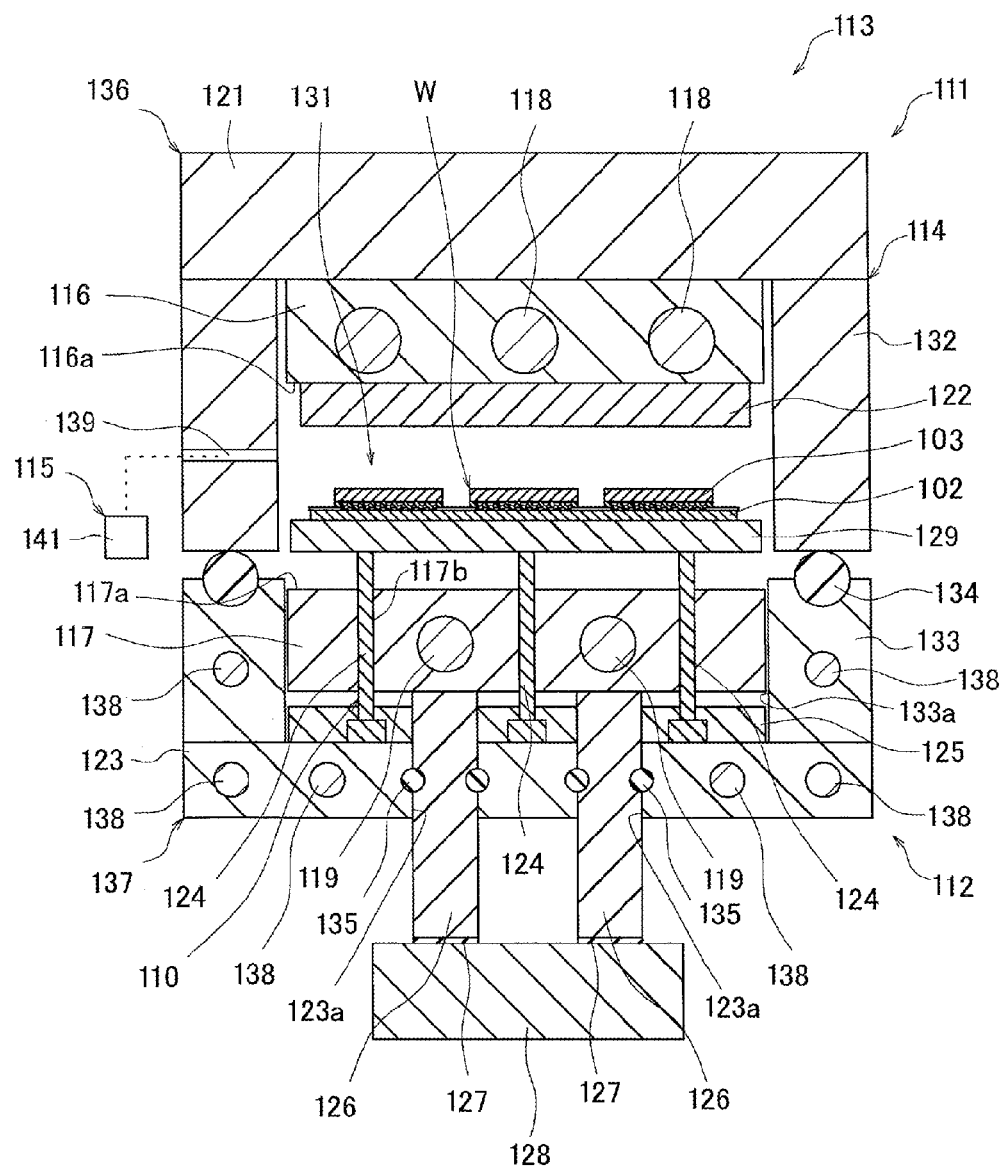
FIG. 13 is a sectional view of the bonding apparatus showing a step following the steps shown FIG. 12.

The supporting mechanism 110 supports the supporting plate 129, on which the work W has been set, in a state where the supporting pins 124 are projected from the clamping face 117*a* of the lower heating/pressing section 117 (see FIGS. 12 and 13). The supporting mechanism 110 transfers the work W from the supporting pins 124 to the lower heating/pressing section 117, together with the supporting plate 129, by relatively retracting the supporting pins 124 into the clamping face 117*a* (see FIG. 14). Namely, the work W transferred to the lower heating/pressing section 117 is set on the clamping face 117*a* together with the supporting plate 129.

In the supporting mechanism 110, the work W is floating-supported by the supporting pins 124 until the work W is fed between the upper die 111 and the lower die 112 and transferred from the supporting pins 124 to the lower heating/pressing section 117. Therefore, even if the upper heating/pressing section 116 and the lower heating/pressing section 117 are heated, heat conduction to the work W can be restrained because the work W is floating-supported by the supporting pins 124, which are pierced through the lower heating/pressing section 117. Namely, progress of curing the adhesive layer 104 (FIG. 19), which temporarily bonds the electronic components 103 to the circuit board 102 of the work W, can be restrained. The supporting pins 124 act as insulating pins.

In the heating/pressing mechanism 113, the work W is pressed onto the clamping face 116*a* of the upper heating/pressing section 116, in a state where the work W supported by the supporting plate 129 is set on the clamping face 117*a* of the lower heating/pressing section 117, so as to clamp the work W. Then, the upper heating/pressing section 116 and the lower heating/pressing section 117 clamp and heat the work W. Namely, the lower heating/pressing section 117 is further moved upward in the state of clamping the work W so as to strongly press the work W onto the upper heating/pressing section 116. Therefore, the work W is heated and pressed by the upper heating/pressing section 116 and the lower heating/pressing section 117, and the electronic components 103 can be securely bonded to the circuit board 102 (see FIG. 21).

By clamping the work W between the upper heating/pressing section 116 and the lower heating/pressing section 117, the work W, in which the circuit board 102 and the electronic components 103 are laminated by the adhesive layer 104, can be rapidly heated.

In the bonding apparatus 101A, even if the work W includes the connection bumps 106 melted at prescribed temperature and the adhesive layer 104 melted or cured according to total heat quantity, the work W can be securely bonded. Namely, before thermally curing the adhesive layer 104, the connection bumps 106 are melted, in a short time, so as to bond the connection bumps 106 to the connection pads 105. And then, the adhesive layer 104 cures, so that reliability of bonding the electronic components 103 to the circuit board 102 can be improved. Next, effects of the bonding apparatus 101A will be explained with reference to FIGS. 3A and 3B. In each of FIGS. 3A and 3B, the horizontal axis indicates time t, the left vertical axis indicates viscosity η and the right vertical axis indicates temperature T. The graphs show temperature T of the work W, viscosity ηn of the melted adhesive layer 104 and viscosity ηb of the melted connection bumps 106.

As shown in FIG. 3A, the viscosity ηn of the adhesive layer 104 varies like a U-shaped curve with respect to the time t. In the adhesive layer 104, the viscosity ηn is minimized when a prescribed quantity of heat is applied, and the melted connection bumps 106 can be bonded around the minimum viscosity ηn. In FIG. 3A, the bondable range of the viscosity ηn is below a dotted line. By bonding the melted connection bumps 106 to the connection pads 105 in the range below the dotted line, reliability of bonding the electronic components 103 to the circuit board 102 with the adhesive layer 104 can be improved (see FIG. 21).

As shown in FIG. 3B, in case that the temperature T of the circuit board 102 cannot be increased in a short time, timing of reducing the viscosity ηn of the adhesive layer 104 is earlier than that of the viscosity ηb of the connection bumps 106. Namely, the both timing cannot be coincided with each other. The viscosity ηb of the connection bumps 106 is not lowered in the range where the viscosity ηn of the adhesive layer 104 is below the dotted line. In this case, there is a possibility that the connection bumps 106 of the electronic components 103 cannot be securely electrically bonded to the connection pads 105 of the circuit board 102. However, by employing the bonding apparatus 101A, the temperature T of the work W can be increased rapidly. Therefore, the timing of reducing the viscosity ηn of the adhesive layer 104 can be coincided with that of the viscosity ηb of the connection bumps 106.

Next, the sealing mechanism 114 of the bonding apparatus 101A will be explained. As shown in FIG. 12, the sealing mechanism 114 is constituted by an upper seal block 132 and a lower seal block 133. The upper seal block 132 encloses the upper heating/pressing section 116, and the lower seal block 133 encloses the lower heating/pressing section 117. The seal blocks 132 and 133 seal and close a space for accommodating the work W.

The lower seal block 133 is composed of, for example, alloy tool steel, and has a hollow frame-like shape. The lower seal block 133 is fixed on an upper edge part of the lower base 123. A box section 137, whose upper face is opened, is formed, by the lower base 123 and the lower seal block 133, in the lower die 112. The lower heating/pressing section 117 and the supporting pins 124 are accommodated in the box section 137 of the lower die 112. A sealing member 134, e.g., O-ring, is provided on an upper face of the lower seal block 133.

The upper seal block 132 is composed of, for example, alloy tool steel, and has a hollow frame-like shape. The upper seal block 132 is fixed on a lower edge part of the upper base 121. A box section 136, whose lower face is opened, is formed, by the upper base 121 and the upper seal block 132, in the upper die 111. The upper heating/pressing section 116 is accommodated in the box section 136 of the upper die 111. A lower face of the upper seal block 132 faces the upper face of the lower seal block 133, on which the sealing member 134 is provided.

In the bonding apparatus 101A, a small gap must be formed between each of the supporting rods 126 and an inner face of each of the through-holes 123a so as to smoothly move the supporting rods 126 in the through-holes 123a of the lower base 123. Thus, the sealing mechanism 114 includes sealing members 135, e.g., O-ring, are respectively provided in the through-holes 123a so as to close the gaps between the supporting rods 126 and the inner faces of the through-holes 123a of the lower base 123.

By moving the upper base 121 toward the lower base 123, edges of the box sections 136 and 137 contact each other so that a closed space 131 is formed (see FIG. 13). By accommodating the work W in the closed space 131, the work W can be rapidly heated by the upper heating/pressing section 116 and the lower heating/pressing section 117. In the present embodiment, heaters (heating sections) 138 are provided in the lower base 123 and the lower seal block 133. With this structure, the work W accommodated in the closed space 131 can be rapidly heated.

The lower seal block 133 of the lower die 112 has inner faces 133a, which enclose outer faces of the lower heating/pressing section 117. The inner faces 133a are heated by the heaters 138 provided in the lower seal block 133. Therefore, the lower heating/pressing section 117 is moved upward and downward along the heated inner faces 133a. Since the lower heating/pressing section 117, the lower seal block 133 and the lower base 123 are composed of the same material, e.g., alloy tool steel, their thermal expansion coefficients are equal. Therefore, if the sections in the lower die 112 are uniformly heated, the lower heating/pressing section 117 and the lower seal block 133 similarly expand so that the lower heating/pressing section 117 can be smoothly moved upward and downward.

Next, the pressure adjusting mechanism 115 of the bonding apparatus 101A will be explained. As shown in FIG. 13, the pressure adjusting mechanism 115 has a compressor 141, which is capable of supplying compressed air into the sealed closed space 131 via an air path 139 formed in the upper seal block 132.

In the closed space 131, the adhesive layer 104 (see FIG. 19) is heated by radiation heat from the upper heating/pressing section 116 and the lower heating/pressing section 117. By heating the adhesive layer 104, voids will be formed in the adhesive layer 104, the adhesive layer 104 is expanded and the electronic components 103 will be separated from the circuit board 102. Thus, forming voids can be prevented by increasing the inner pressure of the closed space 131. Further, in the bonding apparatus 101A, a plurality of the electronic components 103 are bonded to the circuit board 102 at a time, so that the heating action can be performed, with applying uniform pressing force, without forming voids. Therefore, reliability of bonding the electronic components 103 to the circuit board 102 can be improved.

The pressure adjusting mechanism 115 may have a decompressor, e.g., vacuum pump, for reducing the inner pressure of the closed space 131 instead of the compressor 141. By reducing the inner pressure of the closed space 131, air in the adhesive layer 104 can be removed. Further, foreign particles suspended in air filling the closed space 131, e.g., fine dust, and oxides badly influencing the adhesive layer 104 can be actively removed. The pressure adjusting mechanism 115 may have the compressor 141 and the decompressor so as to increase the inner pressure of the closed space 131 after reducing the inner pressure of the closed space 131 to remove air in the adhesive layer 104. In this case, the reliability of bonding the electronic components 103 to the circuit board 102 can be further improved.

Figure 14:
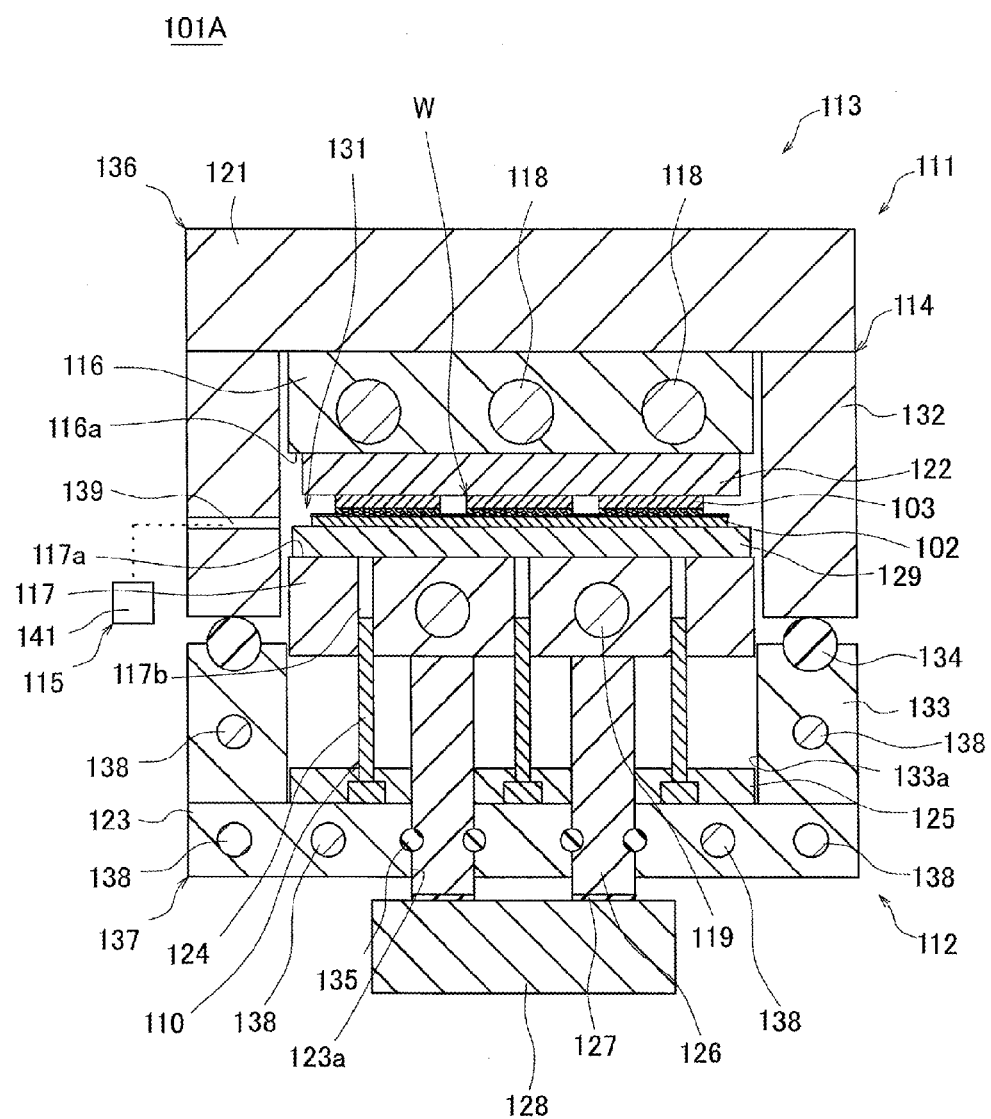
FIG. 14 is a sectional view of the bonding apparatus showing a step following the step shown FIG. 13.
Figure 20:
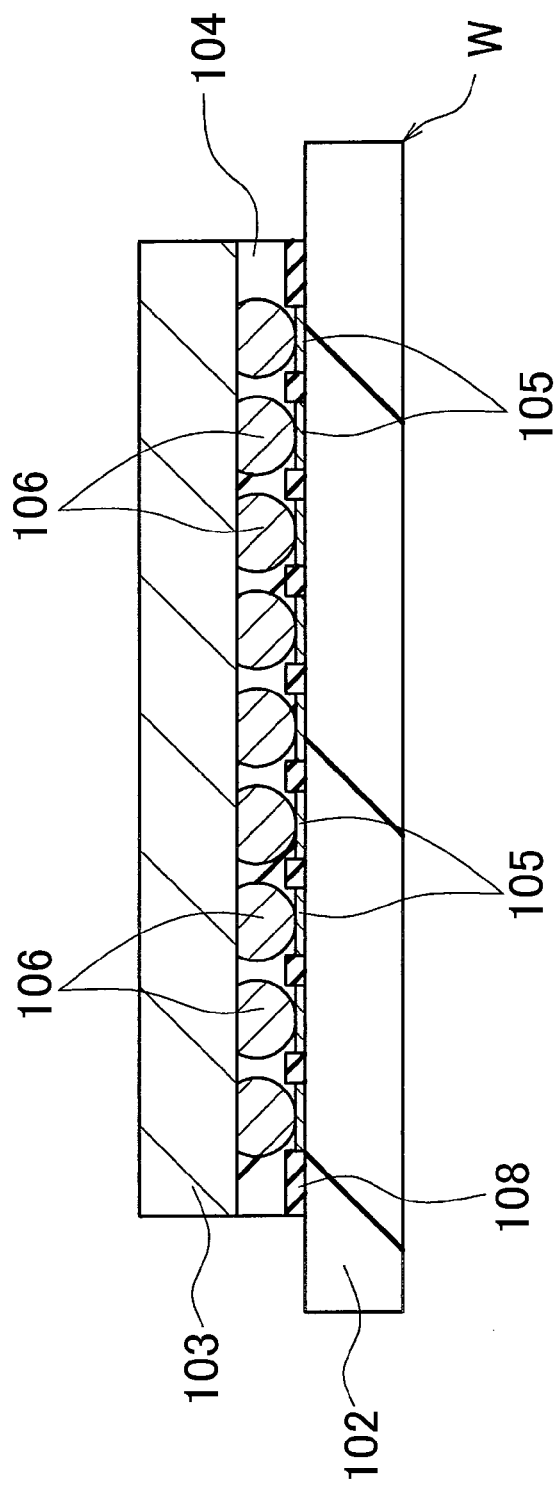
FIG. 20 is a schematic sectional view of the semiconductor device showing a step following the step shown FIG. 19.

The method of bonding the electronic components 103 onto the circuit board 102 and the method of producing the semiconductor devices 107, which are performed by the bonding apparatus 101A, will be explained with reference to FIGS. 12-14 and 19-21. FIGS. 12-14 are schematic sectional views of the bonding apparatus 101A in operation. FIGS. 19-21 are enlarged sectional views of the work W treated by the bonding apparatus 101A.

In the bonding method of the present embodiment, the work W, which includes the circuit board 102 and the electronic components 103 laminated thereon with the adhesive layer 104, is clamped between the upper die 111, which has the upper heating/pressing section 116, and the lower die 112, which has the lower heating/pressing section 117 capable of being moved upward and downward and the supporting pins 124 vertically erected, so as to bond the electronic components 103 to the circuit board 102.

Firstly, as shown in FIG. 19, the circuit board 102 and the electronic components 103 are correctly positioned so as to match the connection bumps 106 with the connection pads 105. The work W, in which a plurality of the electronic components 103 have been laminated on the circuit board 102 with the adhesive layer 104, is prepared. Further, the upper die 111 having the upper heating/pressing section 116 and the lower die 112 having the lower heating/pressing section 117 and the supporting pins 124, which have been explained above as the structural members of the bonding apparatus 101A, are used.

In the work W, the adhesive layer 104 is firstly applied on the circuit board 102, and then a matrix of the electronic components 103 are correctly positioned and temporarily bonded onto the adhesive layer 104 by a known flip-chip bonder (not shown). For example, the circuit board 102 is a glass epoxy board, cable patterns are formed inside of the circuit board 102, and the connection pads 105 are exposed from the insulating layer 108. The electronic components 103, e.g., semiconductor chips, capacitors, have the connection bumps 106, which are composed of, for example, solder. In the present embodiment, the solder bumps 106 are melted and bonded to the connection pads 105.

Next, as shown in FIG. 12, the work W is set on the lower die 112, by a known feeder (not shown), in the state of opening the upper and lower dies 111 and 112. In the lower die 112, the supporting pins 124, which have been projected from the clamping face 117a of the lower heating/pressing section 117, support the work W.

Next, as shown in FIG. 13, the upper and lower dies 111 and 112 are closed until the edges of the box section 136 (the lower end of the upper seal block 132) and the edges of the box section 137 (the upper end of the lower seal block 133) contact each other, so that the closed space 131, which is air-tightly closed by the sealing member 134, can be formed. Then, the pressure adjusting mechanism 115 supplies compressed air into the sealed closed space 131 so as to increase the inner pressure of the sealed closed space 131. The pressurized space is maintained until, for example, the seal of the closed space 131 is released. Preferably, the closed space 131 is formed until at least the adhesive layer 104 cures so as to prevent foam generation and actually discharge air.

After forming the closed space 131, the inner pressure of the closed space 131 may be reduced, by the decompressor, e.g., vacuum pump, via the air path 139, before producing the pressurized space. By reducing the inner pressure, air in the adhesive layer 104 and foreign particles suspended in air filling the closed space 131, e.g., fine dust, can be removed. Therefore, mixing foreign particles into the semiconductor device 107 including the circuit board 102 and the semiconductor components 103 can be prevented.

Next, as shown in FIG. 14, the lower heating/pressing section 117 is moved upward from the state shown in FIG. 13. With this action, the projected supporting pins 124 are relatively retracted into the clamping face 117a of the lower heating/pressing section 117 so as to transfer the work W from the supporting pins 124 to the clamping face 117a. And then, the lower heating/pressing section 117 is further moved upward so as to press the work W, which has been set on the clamping face 117a, onto the clamping face 116a of the upper heating/pressing section 116. Further, the work W is clamped by the upper heating/pressing section 116 and the lower heating/pressing section 117, and the work W is heated and pressed in this clamping state.

The upper heating/pressing section 116 and the lower heating/pressing section 117 have been previously heated. Therefore, the lower heating/pressing section 117 starts to directly heat the work W when the work W is transferred from the supporting pins 124. On the other hand, the upper heating/pressing section 116 starts to directly heat the work W when the work W is pressed by the lower heating/pressing section 117. The work W, which is clamped by the upper heating/pressing section 116 and the lower heating/pressing section 117 from the both sides, is rapidly heated. Note that, temperature of the closed space 131 has been increased by radiation heat from the upper heating/pressing section 116 and the lower heating/pressing section 117, so the work W is indirectly heated.

As shown in FIG. 3A, if the temperature T of the work W is rapidly increased, the connection bumps 106 are rapidly melted. Namely, the viscosity η of the melted connection bumps 106 is rapidly lowered. The adhesive layer 104 is in the molten state when the viscosity ηn of the adhesive layer 104 is in the range below the dotted line shown in FIG. 3A. Therefore, the molten connection bumps 106 can be securely bonded to the connection pads 105 by pressing the both. Namely, reliability of bonding the electronic components 103 to the circuit board 102, with the adhesive layer 104, can be improved.

In the boding apparatus 101A, the work W, in which the electronic components 103 are adhered to the circuit board 102, is clamped to bond the structural members of the work W at a time. Therefore, the semiconductor device 107, in which the electronic components 103 are mounted on the circuit board 102, can be produced.

In the present embodiment, the heating action and the pressing action are simultaneously performed, so that the connection bumps 106 can be melted when the connection bumps 106 are bonded to the connection pads 105. Therefore, the connection bumps 106 can be easily bonded (compression-bonded) to the connection pads 105. The pressurized space is maintained until the electronic components 103 are mounted on the circuit board 102. Therefore, even if tiny amount of air is included in the adhesive layer 104, the tiny air can be compressed and minimized, so that gaps between the circuit board 102 and the electronic components 103 can be well underfilled with the adhesive layer 104. By well underfilling the gaps, poor connection between the connection bumps 106 and the connection pads 105 can be prevented, and reliability of bonding the electronic components 103 to the circuit board 102 can be improved.

Upon completing the step of bonding the work W, the pressure adjusting mechanism 115 stops the pressurization, and the lower heating/pressing section 117 is moved downward to separate the work W from the clamping face 116a of the upper heating/pressing section 116. Next, as shown in FIG. 13, the lower heating/pressing section 117 is moved downward from the state shown in FIG. 14 so as to project the supporting pins 124 from the clamping face 117a of the lower heating/pressing section 117 and transfer the work W to the supporting pins 124. Next, as shown in FIG. 12, the upper die 111 and the lower die 112 are opened (separated), so that the closed space 131, which is constituted by the box sections 136 and 137, is opened. Next, the work W is taken out from the lower die 112 by known conveying means (not shown). By taking out the work W, the one cycle of bonding the work W is completed. Note that, the work W may be cooled, in the state of being supported by the supporting pins 124, until the connection bumps 106 cure, and then the work W may be taken out.

Figure 15:
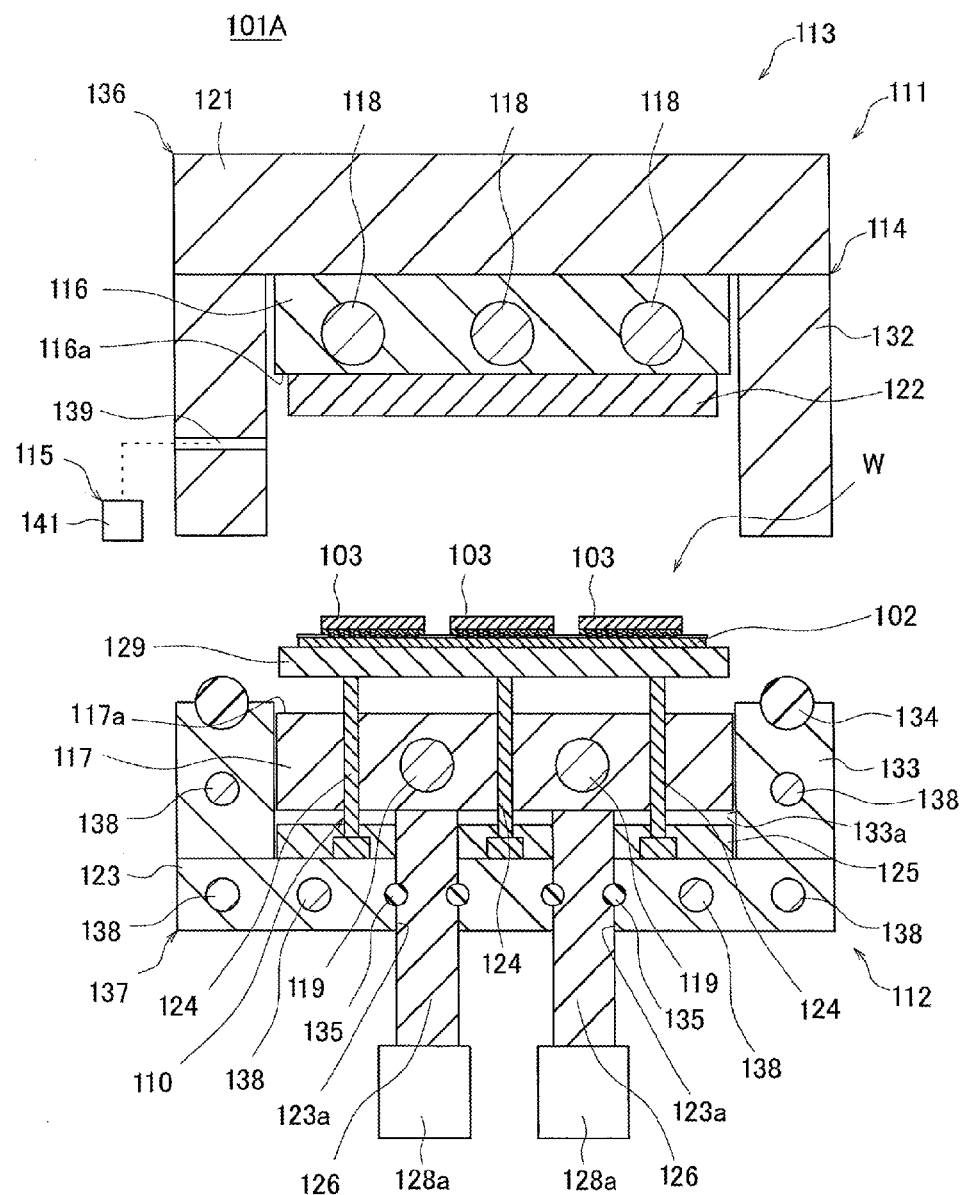
FIG. 15 includes sectional views of a modified example of the bonding apparatus shown in FIG. 12.

In the present embodiment, the supporting rods 126 are fixed to the one elevating section 128, but the supporting rods 126 may be individually moved upward and downward. For example, as shown in FIG. 15, at least three supporting rods 126 may be respectively moved upward and downward, by driving sections 128a, so as to support the lower heating/pressing section 117 with maintaining balance. In this case, posture and position of the clamping face 117a, with respect to the clamping face 116a, can be controlled on the basis of amounts of moving the supporting rods 126 driven by the driving sections 128a and heights of the parts of the clamping face 117a corresponding to the supporting rods 126. With this structure, a clearance between the clamping faces 116a and 117a can be highly precisely equalized when clamping the work W begins. Therefore, the work W can be uniformly clamped, so that no sideling force acts on the electronic components 103 and the bonding can be performed suitably. Even if the work W is large, the entire work W can be clamped with uniform clamping force, so that the bonding can be performed suitably.

Embodiment 7

Next, the apparatus and the method of Embodiment 7 will be explained. Note that, the structural elements described in the above described embodiments are assigned the same symbols and explanation will be omitted.

In the present embodiment, a bonding apparatus 101C will be explained with reference to FIGS. 16-18. In Embodiment 6, the supporting pins 124 fixed to the lower base 123 are used as the supporting means. In the present embodiment, movable supporting pins 141, which are not fixed, are used. Further, in Embodiment 6, the fixed spacer section 122 is used as the spacer section, but a movable spacer section 144 is used in the present embodiment. The unique structures of the present embodiment will be mainly explained.

In the lower die 112, a plurality of the movable supporting pins 141 are respectively pierced through through-holes 123b formed in the lower base 123. Lower ends of the movable supporting pins 141 are fixed to a pin elevating section 142, which can be moved upward and downward. In the present embodiment, the work W is moved to a position short of the upper heating/pressing section 116, without moving the lower heating/pressing section 117, so as to restrain the curing of the adhesive layer 104 until shortly before contacting the upper heating/pressing section 116. Sealing members 143 are respectively provided in the through-holes 123b so as to tightly close gaps between the movable supporting pins 141 and inner faces of the through-holes 123b.

The upper die 111 of the present embodiment has the movable spacer section 144, which is provided under the upper heating/pressing section 116. Namely, the movable spacer section 144 is capable of moving upward and downward under the upper base 121.

The movable spacer section 144 is composed of, for example, alloy tool steel. A plurality of cooling paths 147 are formed in the movable spacer section 144, at regular intervals, along a contact face which contacts the work W (see FIG. 17). By running a cooling medium, e.g., cooled liquid, cooled gas, which is cooled by an external cooling source (not shown), through the cooling paths 147, the movable spacer section 144 can be cooled. Namely, the movable spacer section 144 has cooling function. Further, a plurality of heaters (heat sources) 148 are provided in the movable spacer section 144, at regular intervals, along the contact face which contacts the work W (see FIG. 17). Namely, the movable spacer section 144 has heating function too.

Note that, the cooling function and the heating function of the movable spacer section 144 are not used simultaneously. Therefore, the cooling paths 147 and the heaters 148 are alternately provided, so that the work W contacting the movable spacer section 144 can be fully cooled and heated, the movable spacer section 144 can be made thinner to reduce heat capacity and the temperature of the work W can be rapidly increased and reduced. Note that, the cooling paths 147 and the heaters 148 may be arranged in two rows (an upper row and a lower row) so as to equalize the temperature of the movable spacer section 144. For example, the cooling paths 147 may be arranged in the lower row located close to the clamping face, and the heaters 148 may be arranged in the upper row above the lower row.

The movable spacer section 144 is fixed to lower ends of holding rods 145, which are composed of, for example, alloy tool steel, and suspended by the holding rods 145. A plurality of through-holes 116b are formed and equally spaced in the upper heating/pressing section 116, which is fixed to the upper base 121. A plurality of through-holes 121a, which are respectively communicated to the through-holes 116b, are formed in the upper base 121. The holding rods 145 are pierced through the through-holes 116b and 121a.

Upper ends of the holding rods 145 are fixed to an elevating section 146, which is composed of, for example, alloy tool steel. The elevating section 146 is connected to a vertical driving mechanism (not shown), which is capable of moving the elevating section 146 upward and downward. By moving the movable spacer section 144 upward and downward by actuating the vertical driving mechanism, the holding rods 145 slide on inner faces of the through-holes 116b and 121a. Note that, coil springs may be provided between the upper base 121 and the elevating section 146 so as to adjust the upward and downward movement of the movable spacer section 144.

Figure 22:
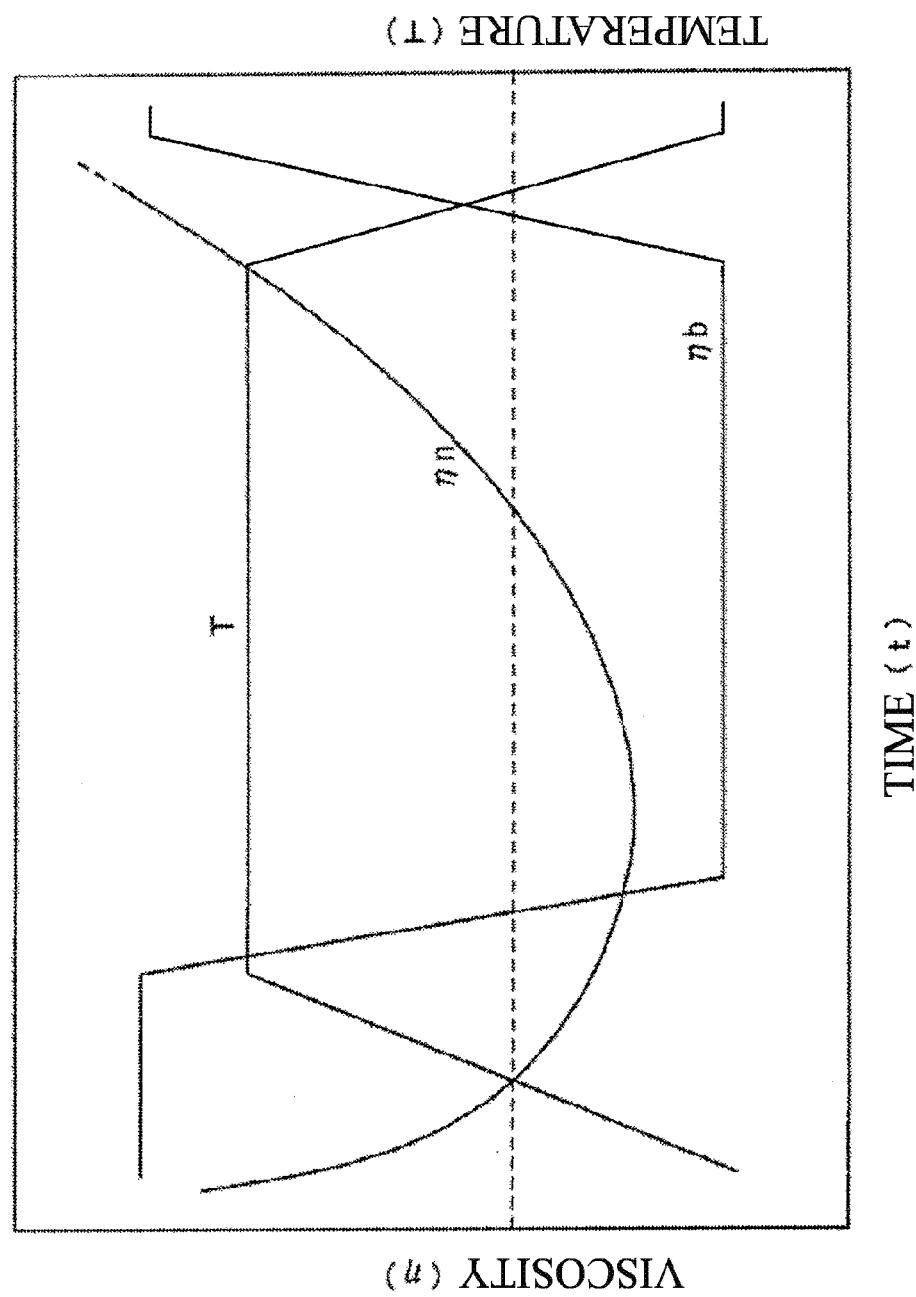
FIG. 22 is a graph showing effects of a bonding method relating to the present invention.
Figure 23A:
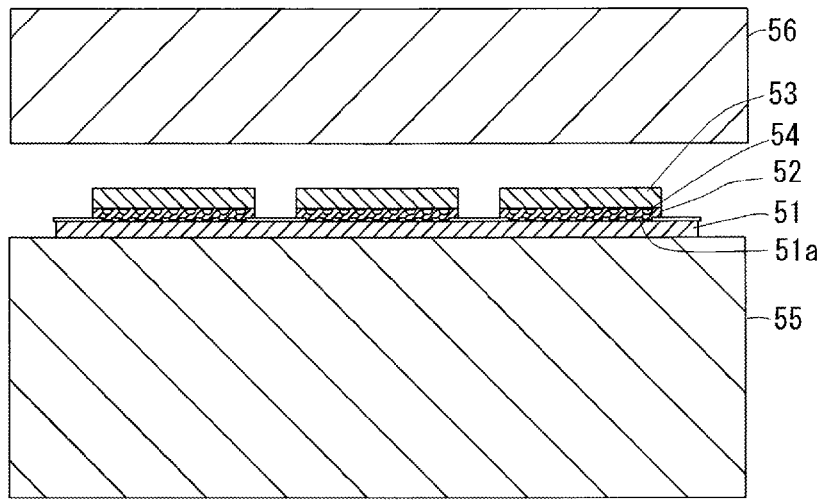
FIGS. 23A and 23B are sectional views of the conventional bonding apparatus, which explains the problems thereof.
Figure 23B:
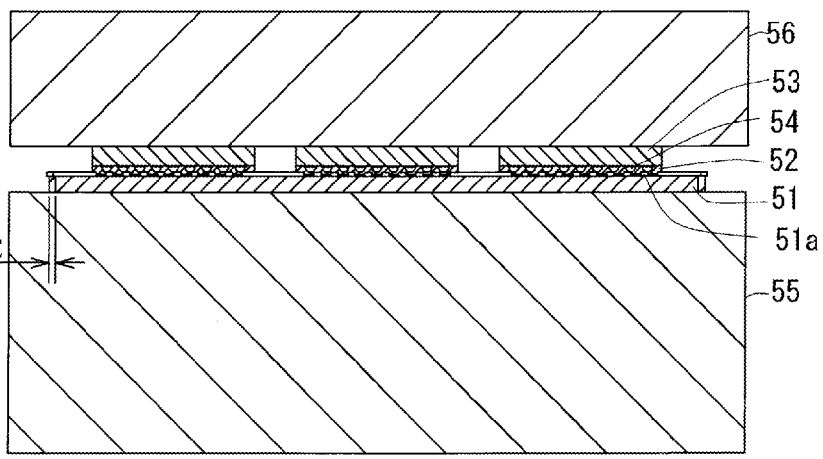

In the present embodiment, the cooling function of the movable spacer section 144 is obtained by the cooling paths 147. Therefore, the cooling function is suspended in a state where the movable spacer section 144 contacts the upper heating/pressing section 116, and the work W supported by the supporting pins 141 is cooled in a state where the movable spacer section 144 is separated from the upper heating/pressing section 116. Namely, when the work W is separated from the upper heating/pressing section 116 and the lower heating/pressing section 117, the heated work W can be cooled by the movable spacer section 144. With this structure, for example, as shown in FIG. 22, the work W can be compulsorily cooled, and the connection bumps 106 can be rapidly cured.

The adhesive layer 104 completely cures in a short time and the bonded parts between the connection pads 105 and the connection bumps 106 are cooled by the cooling function of the movable spacer section 144, so that the bonded parts and their periphery can be tightly connected. Namely, reliability of bonding the electronic components 103 to the circuit board 102 can be improved. For example, the temperatures of the adhesive layer 104 and the connection bumps 106 are reduced in the state of clamping the work W, so that solidifying (curing) the bumps 106, which have been adhered to the connection pads 105, can be accelerated. The temperature of the adhesive layer 104 can be lower than a glass-transition point. Therefore, the connection bumps 106 and the connection pads 105 can be securely electrically bonded each other, and warping the work W, which is cause by shrinkage of the adhesive layer 104, can be prevented. Further, time for cooling the work W can be shortened, so that a throughput speed of the bonding apparatus can be improved.

In some cases, small gaps are formed between the holding rods 145 and the inner faces of the through-holes 121a, because the holding rods 145 slide on the inner faces of the through-holes 121a. Sealing members 149, e.g., O-rings, are provided in the through-holes 121a of the upper base 121 so as to seal the gaps between the holding rods 145 and the inner faces of the through-holes 121a. With this structure, the closed space 131 is formed between the upper die 111 and the lower die 112 (see FIG. 17), so that the work W can be rapidly heated in the closed space 131.

Successively, the bonding method performed in the bonding apparatus 101C, in which the electronic components 103 are bonded to the circuit board 102, at a time, to produce the semiconductor device 107, will be explained with reference to FIGS. 16-18.

Figure 16:
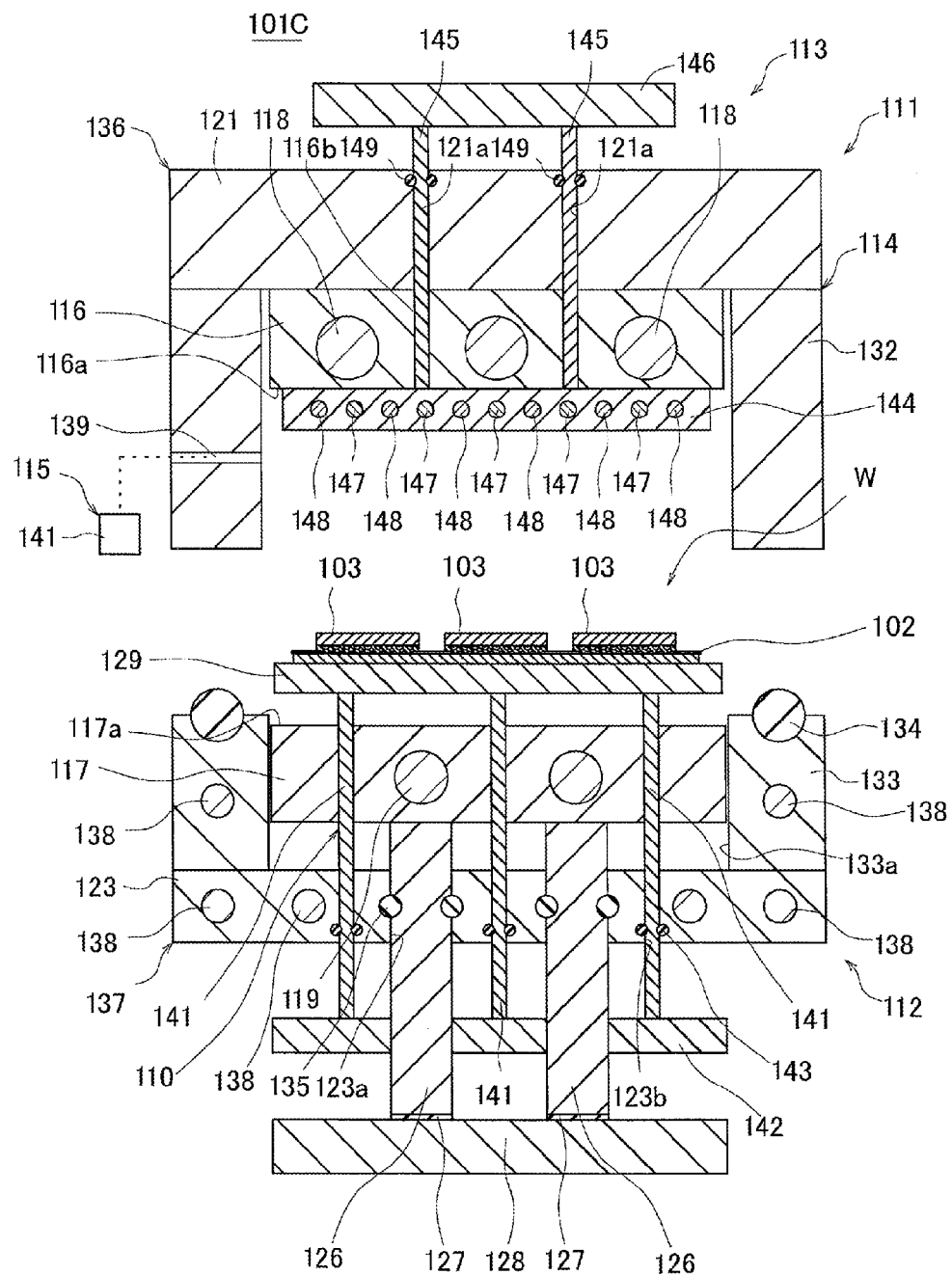
FIG. 16 includes sectional views of a bonding apparatus of Embodiment 7 in operation.

Firstly, as shown in FIG. 16, the upper die 111, which includes the upper heating/pressing section 116 and the movable spacer section 144, and the lower die 112, which includes the lower heating/pressing section 117 and the movable supporting pins 141, are prepared. Next, the work W (see FIG. 19) is set on the lower die 112, by a feeder (not shown), in the opened state of the dies 111 and 112. Concretely, in the lower die 112, the work W is supported by the movable supporting pins 141, which are projected from the clamping face 117a of the lower heating/pressing section 117.

Next, the upper die ill and the lower die 112 are moved close to each other, so that the edges of the box sections 136 and 137 contact each other, with the sealing member 134, so that the closed space 131 is formed. Then, the pressure adjusting mechanism 115 supplies compressed air into the sealed closed space 131 so as to increase the inner pressure of the sealed closed space 131 (see FIG. 13). Next, the movable supporting pins 141 are moved upward, together with the lower heating/pressing section 117, until the work W reaches a position short of the upper heating/pressing section 116 (see FIG. 17).

Figure 17:
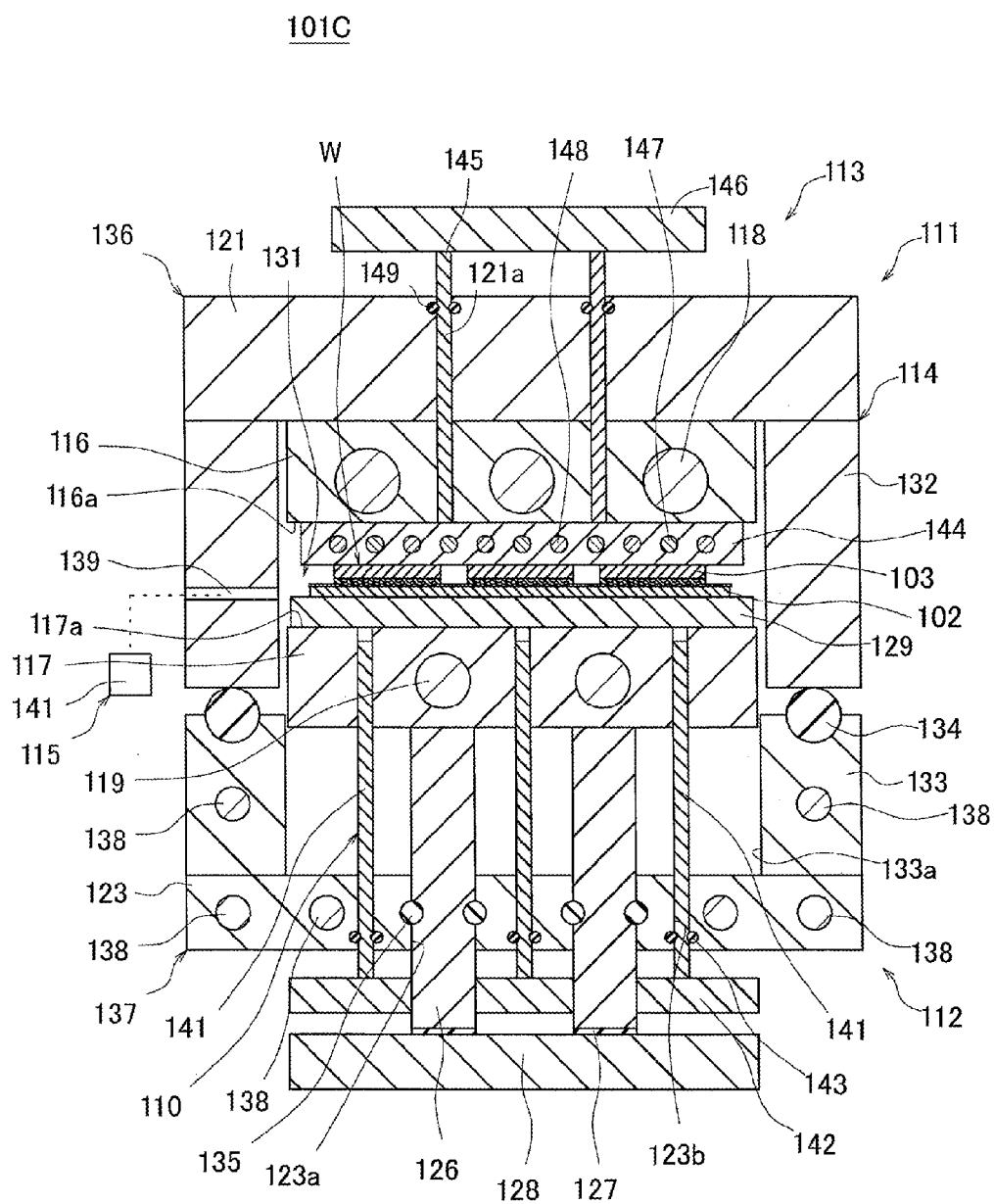
FIG. 17 is a sectional view of the bonding apparatus showing a step following the steps shown FIG. 16.

Next, as shown in FIG. 17, the lower heating/pressing section 117 is moved upward and/or the movable supporting pins 141 are moved downward so as to relatively retract the movable supporting pins 141, so that the work W is transferred from the movable supporting pins 141 to the lower heating/pressing section 117. Then, the lower heating/pressing section 117 is further moved upward, in a state where the movable spacer section 144 whose cooling function has been suspended contacts the upper heating/pressing section 116, to make the work W contact the movable spacer section 144, so that the work W is clamped. Next, the work W is heated and pressed, in the state where the work W is clamped by the movable spacer section 144 of the upper heating/pressing section 116 and the lower heating/pressing section 117, so as to bond the laminated members (i.e., the circuit board 102 and the electronic components 103).

Figure 18:
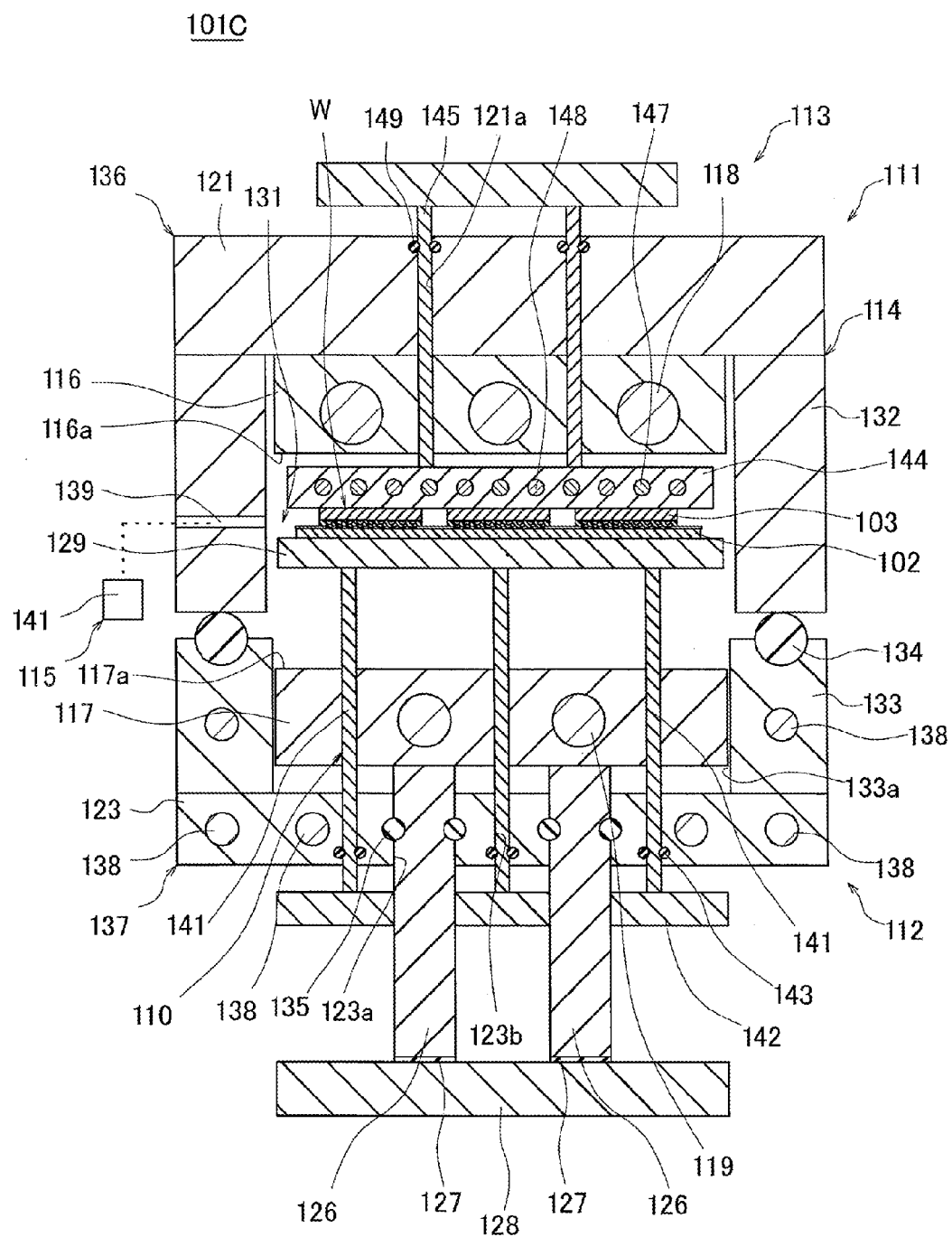
FIG. 18 is a sectional view of the bonding apparatus showing a step following the step shown FIG. 17.

Next, as shown in FIG. 18, the lower heating/pressing section 117 is moved downward so as to project the supporting pins 141 therefrom. Therefore, the work W is transferred from the lower heating/pressing section 117 to the supporting pins 141, so that the work W is supported by the supporting pins 141. The movable spacer section 144 is moved downward in the state where the movable spacer section 144 contacts the work W, so that the work W is separated from the upper heating/pressing section 116. And then, the work W supported by the supporting pins 141 is cooled by the cooling function of the movable spacer section 144.

By cooling the work W supported by the supporting pins 141, the adhesive layer 104 can completely cure in a short time. Simultaneously, the bonded parts between the connection pads 105 and the connection bumps 106 can be cooled. Therefore, the bonded parts and their periphery can be tightly connected. Therefore, reliability of bonding the electronic components 103 to the circuit board 102 can be improved.

As described above, in the bonding apparatus 101C, the work W, which includes the electronic components 103 adhered on the circuit board 102, is clamped and the laminated members can be bonded at a time. Further, the semiconductor device 107, in which the electronic components 103 are mounted on the circuit board 102, can be produced.

After the movable spacer section 144 is moved upward to separate from the cooled work W and its cooling function is suspended, the movable spacer section 144 may be pressed onto the upper heating/pressing section 116 with heating the movable spacer section 144 by the heating function. In this case, the next work W can be fed in a state where reduction of temperature of the upper heating/pressing section 116 is restrained. Therefore, the work W can be rapidly heated, so that reliability of bonding the electronic components 103 to the circuit board 102, with the adhesive layer 104, can be improved.

The preferred embodiments of the present invention have been concretely described above, but the present invention is not limited to the above described embodiments. The embodiments can be modified without deviating from the scope of the present invention.

In the above described embodiments, a first member, e.g., the circuit board, and a second member, e.g., semiconductor chip, are laminated in the work. However, further members (a third member, a fourth member . . . ) may be laminated in the work. For example, a circuit board (the first member), first semiconductor chips (second member) and second semiconductor chips (third member) may be laminated, with adhesive layers, in the work.

In the work W shown in FIG. 19, the connection pads 105 of the circuit board 102 (the first member) do not contact the connection bumps 106 of the electronic components 103 (the second member). However, the work W shown in FIG. 20, in which the connection pads 105 of the circuit board 102 contact the connection bumps 106 of the electronic components 103, may be used. In this case too, the work W is clamped and the electronic components 103 are bonded to the circuit board 102 at a time, so that the semiconductor device 107 (see FIG. 21) can be produced.

In the above described embodiments, the connection bumps 106 of the electronic components 103 are melted by applying heat. Further, the connection pads 105 of the circuit board 102 may be melted, and the both of the connection pads 105 and the connection bumps 106 may be melted. In these cases too, the work W is clamped and the electronic components 103 are bonded to the circuit board 102 as well.

In the above described embodiments, the work W is set on the lower die 112. However, the work W may be held on the upper die 111 by using air suction means, holding claws, etc.

In the above described embodiments, an ultrasonic transducer, which is capable of applying ultrasonic vibration to the clamped work W, may be provided at least one of the upper die and the lower die. Concretely, the work W is clamped in the closed space formed between the upper die and the lower die, and the connection bumps are respectively brought into contact with the connection pads. In this state, the ultrasonic transducer is vibrated, and the connection bumps and the connection pads, which have been mutually contacted, are heated by heaters. Further, the connection bumps and the connection pads, which have been heated, are pressed, so that the connection bumps and the connection pads can be bonded to each other.

The ultrasonic transducer vibrates the connection bumps and the connection pads, which have been mutually contacted, so as to remove the adhesive layer and oxides. By applying ultrasonic vibration to the work W until melting the connection bumps, the adhesive layer and oxides can be effectively removed. Therefore, reliability of bonding the connection bumps and the connection pads of the work can be improved. Note that, in case of applying ultrasonic vibration to the work W, there is a possibility that voids are generated in the adhesive layer. Thus, preferably, the work W is accommodated in the closed space, into which compressed air is supplied to produce the pressurized space, and ultrasonic is applied to the work W.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention has been described in detail, it should be understood that the various changes, substitutions, and alternations could be made hereto without departing from the spirit and scope of the invention.

What is claimed is:

1. A bonding apparatus for flip-chip-bonding bumps of semiconductor devices, which have been adhered on a substrate by a non-conductive adhesive, to terminal sections of the substrate in a state where the semiconductor devices are clamped between an upper die and a lower die, the bonding apparatus comprising:

the upper die having a built-in heat source and a clamping face, the upper die being capable of heating and pressing the semiconductor devices onto the clamping face in a state where the substrate is supported by the lower die; and the lower die having a substrate holding plate and a clamping face, the substrate on which the semiconductor devices have been adhered being mounted on the substrate holding plate, the substrate holding plate being floating-supported, by a plurality of supporting rods, in a state where the substrate holding plate is separated from the clamping face of the lower die so as to increase thermal resistance, wherein the substrate, which is mounted on the substrate holding plate and floating-supported, is moved toward the clamping face of the upper die, by a closing action of the upper die and the lower die, so as to preheat the substrate and the semiconductor devices by radiation heat, the semiconductor devices, which are mounted on the substrate held by the substrate holding plate, are pressed onto the clamping face of the upper die by progression of the closing action, a plurality of the supporting rods are retracted into the lower die and the substrate holding plate is moved until tightly contacting the clamping face of the lower die by completing of the closing action, and the semiconductor devices, which are mounted on the substrate held by the substrate holding plate and which are clamped between the upper die and the lower die, are heated and pressed so as to cure the non-conductive adhesive and bond the bumps of the semiconductor devices to the terminal sections of the substrate.

2. The bonding apparatus according to claim 1, wherein the lower die has a sucking mechanism capable of sucking and holding a surface of the substrate.

3. The bonding apparatus according to claim 1,
wherein
a release film is sucked and held on the clamping face of the upper die.

4. The bonding apparatus according to claim 1,
wherein the substrate supported by the substrate holding plate is accommodated in a closed space, which is formed by the closing action, and
the substrate and the semiconductor devices are heated and pressed in a reduced-pressure atmosphere or a pressurized atmosphere produced in the closed space.

5. The bonding apparatus according to claim 1,
wherein
the semiconductor devices, which are mounted on the substrate held by the substrate holding plate, are heated and pressed, in a state where the semiconductor devices are pressed onto the clamping face of the upper die and the substrate holding plate is clamped by the clamping face of the lower die, by performing the closing action until stopper blocks, which are respectively formed in facing surfaces of the upper die and the lower die, contact each other.

6. The bonding apparatus according to claim 1, wherein a cooler is provided to at least one of a part of the upper die, which corresponds to the semiconductor devices, and a part of the lower die, which corresponds to the terminal sections of the substrate.

7. The bonding apparatus according to claim 1, wherein the plurality of the supporting rods are provided to the lower die and located at positions which do not correspond to the positions immediately under the semiconductor devices.

8. The bonding apparatus according to claim 1, wherein the substrate holding plate is floating-supported by the supporting rods, which are biased by a coil spring provided in the lower die, in a state where upper ends of the supporting rods are projected and separated from the clamping face of the lower die.

* * * * *